(12) United States Patent
Bunger et al.

(10) Patent No.: US 9,222,337 B2
(45) Date of Patent: Dec. 29, 2015

(54) HYDRAULIC FRACTURING

(75) Inventors: Andrew P. Bunger, Clayton (AU);
Robert G. Jeffrey, Clayton South (AU);
Xi Zhang, Clayton (AU); James Kear,
Clayton South (AU)

(73) Assignee: Commonwealth Scientific and Industrial Research Organisation (AU)

( * ) Notice: Subject to any disclaimer, the term of this patent is extended or adjusted under 35 U.S.C. 154(b) by 148 days.

(21) Appl. No.: 13/979,922

(22) PCT Filed: Jan. 18, 2012

(86) PCT No.: PCT/AU2012/000032
§ 371 (c)(1),
(2), (4) Date: Jul. 16, 2013

(87) PCT Pub. No.: WO2012/097405
PCT Pub. Date: Jul. 26, 2012

(65) Prior Publication Data
US 2013/0292124 A1 Nov. 7, 2013

(30) Foreign Application Priority Data
Jan. 20, 2011 (AU) .............................. 2011900180

(51) Int. Cl.
*E21B 43/26* (2006.01)
*E21B 41/00* (2006.01)

(52) U.S. Cl.
CPC ............. *E21B 41/0092* (2013.01); *E21B 43/26* (2013.01)

(58) Field of Classification Search
CPC ............................ E21B 41/0092; E21B 43/26
See application file for complete search history.

(56) References Cited

U.S. PATENT DOCUMENTS

| | | | |
|---|---|---|---|
| 4,830,106 A * | 5/1989 | Uhri | 166/250.1 |
| 5,228,510 A * | 7/1993 | Jennings et al. | 166/263 |
| 6,842,700 B2 | 1/2005 | Poe | |
| 7,111,681 B2 | 9/2006 | Detournay et al. | |
| 7,516,793 B2 | 4/2009 | Dykstra | |

OTHER PUBLICATIONS

International Patent Application No. PCT/AU2012/000032, International Search Report mailed Mar. 7, 2012 (3 pages).

* cited by examiner

*Primary Examiner* — William P Neuder
(74) *Attorney, Agent, or Firm* — Kilpatrick Townsend & Stockton LLP

(57) ABSTRACT

Method and apparatus for forecasting curving of an hydraulic fracture to be initiated in the vicinity of one or more previously placed fractures along a bore hole. Physical parameters that will affect the growth of the hydraulic fracture are received by a dimensionless parameter deriver which derives a series of dimensionless parameters as groupings of the physical parameters that are selected as similarity parameters with respect to the shape of the hydraulic fracture path. The dimensionless parameters may comprise a dimensionless viscosity parameter, a dimensionless confining stress parameter, a coefficient of friction parameter and a dimensionless deviatoric stress parameter. A comparator sequentially compares the determined dimensionless parameters with predetermined threshold values to provide an indication as to possible curving of the hydraulic fracture.

20 Claims, 10 Drawing Sheets

Sketch of the problem

Crack paths with varying $S$ for toughness dominated regime, with $D=0.5$ (left) and $D=1$ (right)

Crack paths for varying $W$ for toughness dominated regime and with $S=0$ and $S=0.5$ Scaled crack path deflection for toughness (left) and viscosity (right) dominated cases.

Crack paths for different values of D and S, contrasting the
$f=0$(light lines) and $f=0.4$(bold lines) cases.

Analysis of $f^{crit}$ for toughness(left) and viscosity(right) dominated cases

Solution for scaled crack path deflection in the "elastic" cases.

The principal stress vectors around a uniformly pressurized fracture embedded in an elastic material, for four values of D/W. The contours of the orientation of maximum stress with respect to the x-axis direction are shown, with contours given in degrees counter clockwise rotation positive.

Method for determining if a hydrolic fracture satisfies sufficient conditions for neglecting curving.

Interpretation of Oak Ridge National Experimental Injection fracture location data.

Block 4, cut in half to reveal coalescing hydraulic fracture paths.

Block 3, unnotched specimen cut in half to reveal complex fracture paths.

Block 6, cut in half to reveal sub-parallel fracture paths, with the exeption of fracture 3 which on closer inspection may have resulted from an inadequate notch.

HYDRAULIC FRACTURING

CROSS-REFERENCE TO RELATED APPLICATIONS

The present application is a national phase of PCT/AU2012/000032, filed Jan. 18, 2012, which claims the benefit of priority to Australian Patent Application No. 2011900180, filed Jan. 20, 2011, each of which is incorporated herein by reference in its entirety.

TECHNICAL FIELD

This invention relates to hydraulic fracturing of natural ground formations which may be on land or under a sea bed.

Hydraulic fracturing is a technique widely used in the oil and gas industry in order to enhance the recovery of hydrocarbons. A fracturing treatment consists of injecting a viscous fluid at sufficient rate and pressure into a bore hole drilled in a rock formation such that the propagation of a fracture results. In later stages of the fracturing treatment, the fracturing fluid contains a proppant, typically sand, so that when the injecting stops, the fracture closes on the proppant which then forms a highly permeable channel (compared to the permeability of the surrounding rock) which may thus enhance the production from the bore hole well.

In recent years, hydraulic fracturing has been applied for inducing caving and for preconditioning caving in the mining industry, especially for block caving and panel caving. In this application, the fractures are typically not propped but are formed to modify the rock mass strength to weaken the ore to be mined or surrounding country rock. Hydraulic fracturing can also be applied to fracturing of in-seam or surface to in-seam holes for gas drainage in coal mining, for fracturing vertical or horizontal wells for stimulation of shale gas or shale oil, for generating surface area and conductivity for in-situ leaching, for generating surface area and conductivity for $CO_2$ sequestration in ultramafic rocks or for stimulation of geothermal wells by multiple hydraulic fractures or connecting a well to a reservoir by generation of multiple parallel hydraulic fractures. Typically multiple hydraulic fractures may be initiated at locations along a bore hole drilled into the rock by the installation of inflatable packers and pumping hydraulic fracturing fluid into spaces between the packers. The bore hole may be generally horizontal but the direction of the bore hole will depend on the particular application for which hydraulic fracturing is to be employed.

A problem with placing multiple hydraulic fractures at intervals along a bore hole is that mechanical interaction between a growing hydraulic fracture and one or more previous hydraulic fractures can affect the fracture geometry. During the treatments, the fractures can curve toward or away from one another, potentially intersecting one another, such that the final fracture array is sub-optimal for the intended purpose such as well stimulation, mine caving, in-situ leaching or gas sequestration. The present invention enables the potential for such curving to be forecast. It then becomes possible to plan placement of a series of fractures under conditions by which interference between successive fractures is avoided, for example by adopting spacing and controlling the injection conditions such that curving is negligible or even completely suppressed.

DISCLOSURE OF THE INVENTION

The invention may be said to broadly comprise a method for producing a forecast of curvature of an hydraulic fracture to be initiated in the vicinity of one or more previously placed fractures along a bore hole, comprising:

deriving from independent physical parameters that will affect the growth of the hydraulic fracture a series of dimensionless parameters as groupings of the dimensional parameters which are similarity parameters with respect to the shape of the hydraulic fracture path;

determining from the dimensionless similarity parameters an indication as to possible curvature of the hydraulic fracture; and producing a forecast in accordance with said indication.

The determination of said indication may be made by sequentially comparing the determined values of the dimensionless similarity parameters with predetermined threshold values.

The threshold values may be predetermined by numerical modelling, for example by use of a coupled 2D numerical fracturing simulator.

The similarity parameters may include any one or more of a dimensionless deviatoric stress based on a comparison of full field deviatoric stress with stress induced by the growing hydraulic fracture a dimensionless confining stress based on a comparison of far-field minimum stress with stress induced by the growing hydraulic fracture a dimensionless viscosity a dimensionless propped opening based on a comparison of stress induced by the growing hydraulic fracture with stress induced by a prior placed fracture on one side or on either side of it.

The invention further extends to a method of planning the initiation of a series of hydraulic fractures along a bore hole, comprising performing the above method for differing individual dimensionless parameters to determine the possibility of curvature of each new fracture to be initiated and selecting dimensional parameters that produce non-dimensional similarity parameters found to favour non-curved fracture growth.

A minimum spacing between adjacent hydraulic fractures may be selected consistent with promotion of a substantially non-curved fracture growth.

The invention further extends to a method of initiating a series of hydraulic fractures along a bore hole, comprising obtaining a plan derived by a method as defined in either of the two preceding paragraphs and initiating a series of hydraulic fractures in accordance with the selected dimensional parameters.

The invention may also provide apparatus for forecasting curvature of an hydraulic fracture to be initiated in the vicinity of one or more previously placed fractures along a bore hole comprising:

an input data receiver to receive input data indicative of independent dimensional parameters that will affect growth of the hydraulic fracture;

a dimensionless parameter deriver to derive from the input data derived data indicative of a series of dimensionless parameters as groupings of the dimensional parameters that are effective as similarity parameters with respect to the shape of the fracture growth path;

a comparator to compare the derived data indicative of said dimensionless similarity parameters with predetermined threshold values providing an indication of possible curvature of the hydraulic fracture path; and an outputter to output a forecast of fracture curvature in accordance with the indication provided by the comparator.

BRIEF DESCRIPTION OF THE DRAWINGS

The invention and the manner in which it may be put into effect will now be described in more detail with reference to the 36 references listed at the end of this specification and the accompanying drawings, in which FIG. 1 diagramatically illustrates growth of an hydraulic fracture HF2 adjacent a previously placed hydraulic fracture HF1.

DETAILED DESCRIPTION OF THE PREFERRED EMBODIMENT

Introduction

Figure 1:
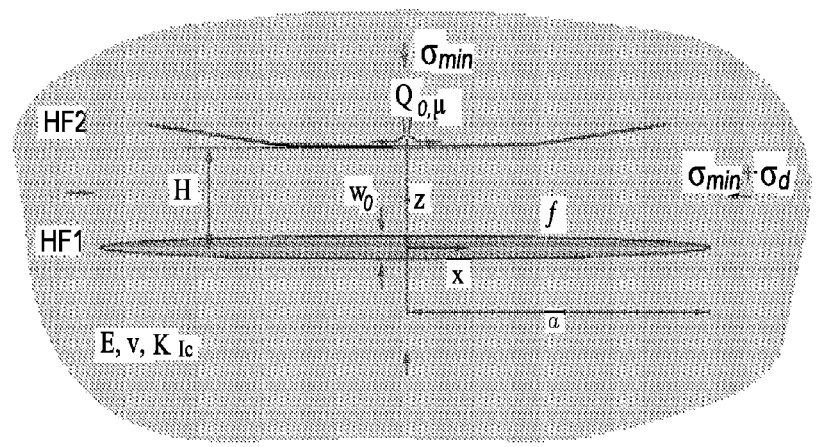

Stimulating horizontal wells by placing hydraulic fractures into isolated zones along the wellbore is an effective, and in many ways still emerging, technique (e.g. see the review by Rodrigues et al. 2007). Several possible fracture geometries have been proposed depending on the relative orientation of the wellbore to the least compressive horizontal principal stress component in the reservoir (e.g. Abass et al. 2009, FIG. 1). Fractures growing transverse rather than longitudinally with respect to the wellbore are expected when the wellbore is within about 15 degrees of the minimum horizontal stress direction (El Rabaa 1989). Decisions regarding the optimum number of hydraulic fractures to place along a horizontal wellbore are typically based on production forecasting from reservoir models (e.g. Soliman et al. 1990, Sandrpanah et al. 2006), and for transverse fracturing the hydraulic fractures are almost invariably assumed to be parallel and identical to one another and to be symmetric about the wellbore.

In contrast to these assumptions, the laboratory experiments of Crosby et al. (2002) show closely spaced hydraulic fractures that do not remain planar, but instead curve as they influence one another. Furthermore, laboratory experiments performed by El Rabaa (1989) suggest that hydraulic fractures from very closely spaced perforations can interact, particularly with the effect that one fracture will dominate the others under simultaneous growth conditions. An important question, then, is under what conditions is it valid to assume planar, symmetric, identical hydraulic fractures are formed.

Parallel fractures have been documented by coring and mine through mapping. For example, the hydraulic fractures placed into well MWX-1 in the paludal interval at the Multi-well Experiment Site were cored through in 1990. The hydraulic fractures in the core consisted of 30 separate parallel strands over a 4 ft (1.2 m) interval and a second 3 ft (1 m) interval was found with eight parallel strands (Warpinski et al. 1993). In a study involving mining and mapping fractures in coal, Steidl (1993) described parallel sand-filled fractures in the roof rock extending up to 300 ft (91 m) from the well. The water frac treatments that produced the parallel fractures contained several stages with pump shutdowns as part of the design. Jeffrey et al. (1994) described a hydraulic fracture mined and mapped in the Great Northern coal seam that consisted of two parallel vertical fractures separated by 0.1 to 0.8 m that remained parallel for a distance of more than 20 m from the well. The type of proppant contained in the two fracture channels indicated that one had formed early in the treatment and the other later. The hydraulic fractures mapped in the coal seam environments are thought to have been guided, to some extent, by pre-existing natural fractures. A case of parallel hydraulic fracture growth, created during experiments at Oak Ridge National Laboratory, will be discussed in detail below, after the results section of this paper.

As a first step in our analysis, we focus on hydraulic fracture curving caused by interaction with a previously placed hydraulic fracture. Consideration of the coupled problem of hydraulic fracture propagation, including viscous fluid flow in the fracture, is crucial and therefore this analysis makes use of a coupled 2D hydraulic fracture simulator. A parametric study is then carried out in order to identify the most important groupings of parameters controlling the fracture geometry so that these can be used to broadly predict the degree to which multiple fractures in an array will interact, and to consider how changing parameters such as fluid viscosity, injection rate, spacing between fractures, or frictional properties of the proppant can impact on the fracture interaction.
Numerical Simulation Numerical predictions of hydraulic fracture growth are carried out using a 2D (plane strain) research simulator that is based on the Displacement Discontinuity Method (Crouch and Starfield 1983) for solution to the elasticity equations and the Finite Difference Method for solution to the coupled fluid-flow problem. Details of the algorithm and implementation are given by (Zhang et al. 2007, 2008, 2009). The features of the model that are used in this investigation are:
1) Fully coupled simulation through simultaneous numerical solution to the Lubrication Equation for laminar, Newtonian fluid flow in the fracture, elastic deformation of an isotropic, impermeable, homogeneous rock, and fracture propagation according to Linear Elastic Fracture Mechanics. Note that by limiting consideration to an impermeable rock, we eliminate the possibility of poroelastic stress changes such as those considered by Roussel et al. (2010).
2) Determination of the crack path according to the maximum tensile stress criterion of Erdogan and Sih (1963).
3) The existence of a finite fluid lag region at the tip, the size of which is a part of the coupled solution and which is expected to be important in low stress, large viscous dissipation cases (Garagash and Detournay 2000).

4) Consideration of potential for sliding of existing fracture surfaces (i.e. a previous hydraulic fracture) according to Coulomb's friction law.

5) Consideration of the propped opening of existing hydraulic fracture(s) with an elliptical opening distribution, i.e. assuming the propped width varies like the opening produced by a uniform pressurize in the fracture.

We take a reductionist's approach and limit the scope of the investigation to the interaction between a single growing hydraulic fracture (HF2) with a single previously placed hydraulic fracture (HF1) that has a length a, maximum width $w_o$ and friction coefficient f. FIG. 1 shows the configuration that is considered. Here the initial spacing is denoted by H. For consistency, the initial length of HF2 is taken as 1.2H. Taking a different value would slightly change the results presented. The initial condition on the fluid lag, on the other hand, is of little consequence to the results we present and it is rather arbitrarily taken that the fluid initially occupies ⅜ of HF2 because this starting value gives stable computations at early time. The rock is characterized by its Young's modulus E, Poisson's ratio v, and mode I fracture toughness $K_{Ic}$. Newtonian fluid with viscosity μ is injected at a constant rate $Q_o$ from a point source located at the center of HF2. The rock is subjected to the far-field stresses $\sigma_{min}$ and $\sigma_{max}=\sigma_{min}+\sigma_d$. Finally, we assume both wings of HF2 grow symmetrically and neglect Interactions that would produce non-symmetric growth of HF2 such as perturbation of the location of the center of HF1. We then make use of spatial symmetry to reduce the computational effort by considering only the right half of the problem portrayed by FIG. 1.

Dimensional Analysis and Scaling

One approach to this parametric study would be to present a collection of solutions for various values of the input parameters. This is a common approach, and on the surface it is straightforward compared to the dimensional analysis and scaling arguments presented in this section. But we would not be able to accomplish the goal of determining the basic conditions under which the hydraulic fractures interact and the effect of those interactions on the fracture path. We could show some specific conditions under which the solution would have a specific behavior, but there would be no means to translate a given numerical result to a case that does not have very nearly the same values for all of the input parameters. Furthermore, as shown below, this problem has 11 input parameters. Even if we were to examine a modest three values for each parameter, we would have to run over 1300 cases, requiring months of labor and years of CPU time. More importantly, even after all of this simulation we would still not illuminate properties of the system such as conditions under which the influence of certain parameters can be neglected or taken to be dominant. Hence, performing a straightforward parametric analysis in terms of dimensional parameters is neither effective nor practical. In contrast, we will make use of dimensional analysis and scaling arguments in order to propose dimensionless groups of parameters and methods of scaling the solution in order to both reduce the number of independent parameters to be investigated and to apply the numerical results more generally so that a solution obtained for one combination of parameter values gives insight to other combinations of parameter values. A detailed general presentation of dimensional analysis and scaling methods is presented by Barenblatt (1996).

The solution to the problem consists of the hydraulic fracture width (opening) w and fluid pressure $p_f$, the evolution of the x and z locations of the tip of HF2 (defining the path of the fracture) which are denoted X and Z, respectively, and the proportion of the fracture that is filled with fluid, $\xi_f$. The width and pressure are functions of position along HF2, and all of these quantities are functions of time t and the parameters characterizing the problem described in the previous section. We will further limit the scope to investigation of only the crack paths. In this context, w, $p_f$, and $\xi_f$ are intermediate solutions that are used to arrive at a final result for the crack path {X,Z}, which depends on the input parameters. This problem can therefore be expressed in abstract form as $$\{X,Z\}=F(H,E,v,K_{Ic},\mu,Q_o,f,w_o,a,\sigma_{min},\sigma_d) \quad (1)$$

Typically, then, one would choose a system of units, for example SI units so that for length, force and time we have meters, Newtons, and seconds, and enter the input parameters accordingly. The solution would then also be in terms of this system of units. Obviously, if we choose a different set of units (i.e. feet, pounds, and minutes), the solution must be unchanged up to a rescaling that would transform it back into the original set of, in this example, SI units. While intuitively obvious, the fact that the physical laws that underlie our model cannot depend on the choice of units is the basis for the well known Buckingham Π-theorem (Buckingham 1914 and see e.g. Barenblatt 1996, Section 1.2.1). We will make use of this theorem's two components. Firstly, we will seek to express the solution in terms of dimensionless quantities that are formed from combinations of the input parameters. Secondly, we expect that the number of independent dimensionless input parameters will be at most equal to the number of dimensional input parameters (11) minus the number of dimensions in the problem, which is in this case three: Length, Force, and Time.

The choice of dimensionless groups of parameters is, on the one hand, arbitrary with a large number of choices possible. However, here we are interested in identifying so-called similarity parameters with respect to the crack path. That is, we wish to find those dimensionless groups of parameters that give the same crack path, when the solution is appropriately scaled, for all simulations, regardless of the values of the dimensional parameters, provided that the similarity parameters take on the same values. While dimensional analysis can help us propose candidates for similarity parameters, it is not sufficient in this case to determine which of these candidates to use. Our approach, then, is to draw on past research on similarity parameters for the paths of hydraulic fractures growing near a free surface (Bunger et al. 2008) and for the role of viscous dissipation in plane strain hydraulic fractures (Adachi 2001; Detournay 2004) in order to propose the following:

$$\left\{\frac{X}{H},\frac{Z}{H}\right\}=\Phi\left(D,S,M,f,v,W,\frac{a}{H}\right)$$

Hence, in addition to f, v, and a/H, which have already been introduced, the proposed set of similarity parameters for this system includes:

A dimensionless deviatoric stress $$D=\frac{\sigma_d\sqrt{H}}{K_{Ic}} \quad (3)$$

which compares the magnitude of the far-field deviatoric stress $\sigma_d/2$ to $K_{Ic}/\sqrt{H}$, which is the magnitude of the stress induced by HF2 when its length is on the order of the fracture separation H. This parameter affects fracture curving because the fracture will tend to remain planar with its opening in the direction of the least compressive stress when the deviatoric stress is strong relative to the crack induced stress. Indeed, Berchenko and Detournay (1997) show that a hydraulic fracture will follow the trajectory of the maximum principal stress when a parameter such as D is larger than a critical value.

A dimensionless confining stress $$S = \frac{\sigma_{min} \sqrt{H}}{K_{Ic}} \qquad (4)$$

which compares the magnitude of the far-field minimum stress to the magnitude of the stress induced by HF2 when its length is on the order of the fracture separation H. As will be subsequently demonstrated by the numerical simulations, this parameter determines whether HF2 induces opening on HF1 and as such plays an important role in determining how HF2 curves.

A dimensionless viscosity $$M = \frac{\mu' E'^3 Q_o}{K'^4} \qquad (5)$$

which was recognized by Spence and Sharpe (1985) and confirmed as a dimensionless viscosity that embodies the importance of viscous dissipation for plane strain hydraulic fractures by Carbonell et al. (1999). Consistent with prior works, this parameter makes use the following nomenclature to reduce clutter $$E' = \frac{E}{1-v^2}, \mu' = 12\mu, K' = \left(\frac{32}{\pi}\right)^{1/2} K_{Ic}$$

A dimensionless propped opening $$W = \frac{w_o E' \sqrt{H}}{K_{Ic} a} \qquad (6)$$

which compares the stress induced by HF2, again estimated by $K_{Ic}/\sqrt{H}$, to $w_o E'/a$, which gives an estimate of the stress induced by HF1 in the rock on either side of it (e.g. Tada et al. 2000).

Extensive numerical simulation was carried out to confirm that these quantities are similarity parameters for this problem. These details will not be presented here. However, based on the success of the verification, the parameters identified in Eq. 2 are considered as a set of similarity parameters that are sufficient to determine the normalized crack paths {X/H,Z/H}. This is not to say, of course, that this is the only similarity scaling—one can actually construct an infinite number of alternative similarity scalings by multiplying each of the similarity parameters in Eq. 2 by arbitrarily chosen powers of the others. In fact, as will be shown in the following, Eq. 2 provides an appropriate similarity scaling for hydraulic fractures that are propagating in the so-called toughness dominated regime or in the transition between the toughness dominated and viscosity dominated regimes. As pointed out by Garagash and Detournay (2005), these cases correspond to M<1. On the other hand, for viscosity dominated hydraulic fractures, that is, for M>1, the solution becomes independent of $K_{Ic}$. This phenomenon was recently observed in simulations of hydraulic fractures that curve as they grow from the wellbore (Zhang et al. 2010). Hence, in the case of viscosity dominated hydraulic fractures, Eq. 2 is not incorrect; however, it can be reduced to $$\left\{\frac{X}{H}, \frac{Z}{H}\right\} \sim \Phi\left(DM^{-1/4}, SM^{-1/4}, f, v, WM^{-1/4}, \frac{a}{H}\right), \qquad (7)$$
$$M > 1$$

Again, extensive numerical simulation has been used to confirm this similarity scaling and these details will not be presented here. Also note that multiplying D, S and W by $M^{-1/4}$ is equivalent, up to a numerical factor, to replacing $K_{Ic}$ with $(\mu Q_o E'^3)^{1/4}$, as has been previously used by Jeffrey and Zhang (2010) and Zhang et al. (2010).

Before moving on to a study of the influence of the parameters listed in Eq. 2 or 7, it is worth making a note that the value of the scaled propped opening, W can sometimes be taken to have an upper bound provided by the solution for a plane strain hydraulic fracture under either toughness or viscosity dominated conditions. Using the scaling relationships presented by Adachi (2001) and Detournay (2004), $w_o \sim a^{1/2} K'/E'$ for the toughness dominated case and $w_o \sim a^{1/2} (\mu' Q_o/E')^{1/4}$ for the viscosity dominated case. Substituting into Eq. 6 one obtains the bounds $W \lesssim (H/a)^{1/2}$ and $W M^{-1/4} \lesssim (H/a)^{1/2}$, valid for the toughness and viscosity dominated regimes, respectively. Throughout the parametric study that follows we will generally consider W independently of these bounds so that its mechanical role can be more fully appreciated, however, it is important to note that in some cases this means that consideration is given to HF1 being propped to a width that would not be expected to occur in applications.

Hydraulic Fracture Curving
Summary

When HF2 is relatively close to HF1 (large a/H), under certain conditions HF2 will curve due to interaction with HF1. This curving will be shown in the following to be either attractive, with HF2 approaching HF1, or repulsive, with HF2 curving away from HF1 and potentially into the path of subsequent hydraulic fractures.

All crack curving is the result of non-symmetry of the stresses acting in the region near the crack tip, and in this case the possible non-symmetry is due to one or more of three sources:

1. Opening of HF1 in response to tensile stresses induced by HF2
2. Sliding of HF1 which, according to the Coulomb friction law, is limited in its ability to sustain shear stresses induced by HF2
3. The perturbation to the local stresses caused by the propping of HF1.

In short, it will be shown that increasing S, and to a lesser degree W, suppresses the opening of HF1 and therefore eliminates curving source number 1. Increasing f in combination with S and, again to a lesser degree W, suppresses sliding along HF1 and therefore eliminates curving source number 2. In the absence of curving sources number 1 and 2, one is left with an elastic contribution from HF1 and a solution wherein the curving increases in magnitude with increasing W, decreasing D, and strikingly, with decreasing a/H provided that a/H≉8. We can re-phrase this result to say that provided the fractures are close together and curving sources 1 and 2 are suppressed, bringing them closer together will decrease, rather than increase, the curving due to their Interaction. A mechanical explanation of this important and initially non-intuitive result is detailed in the sections that follow. We will henceforth refer to the situation where curving is due only to source number 3 as the elastic case, although one must bear in mind that the problem still includes coupling with viscous fluid flow.

In all cases, increasing D decreases the magnitude of the curving because a strong deviatoric stress makes it more difficult for HF2 to propagate out of its original plane.

When consideration is limited to either toughness dominated ($\mathcal{M} \lesssim 0.025$ according to Garagash and Detournay 2005) or viscosity dominated ($\mathcal{M} \gtrsim 1$) hydraulic fracture growth, M is either small and can be neglected, or else its influence is completely accounted for by rescaling D, S, and W as indicated by Eq. 7. The effect of changing the value of Poisson's ratio ν was found to be very small, and henceforth it will be taken as 0.2.

Suppression of Opening on HF1

Figure 2:
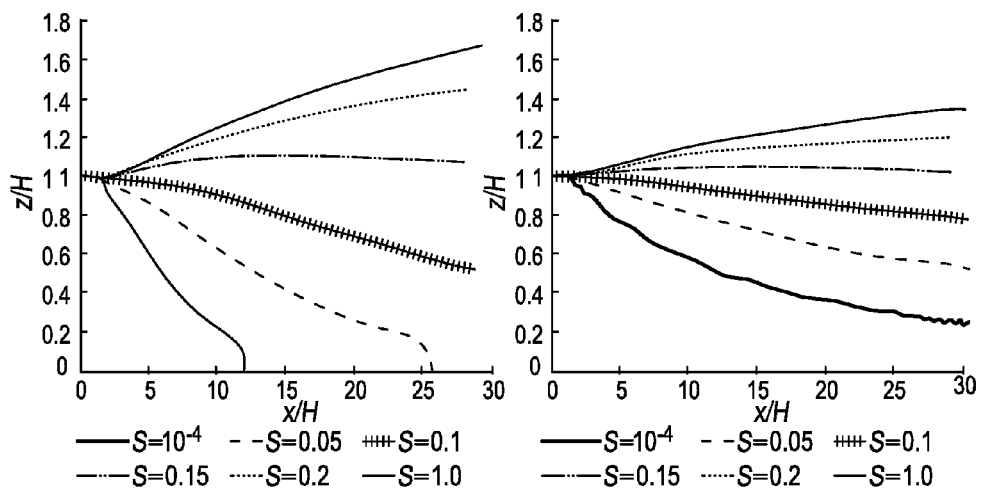
FIG. 2 illustrates differing fracture growth paths obtained with differing dimensionless deviatoric stress and confining stress parameters D and S (D=0.5 at left and D=1 at right)
Figure 3:
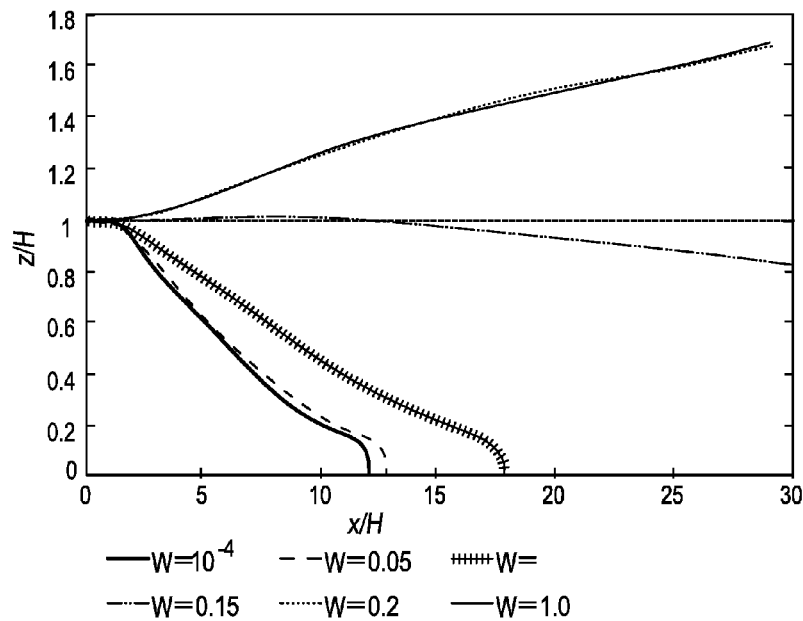
FIG. 3 illustrates differing fracture growth paths for varying values of a dimensionless propped opening W for toughness dominated regime and with S→0, S→∞.

Looking now in detail at the curving problem, FIG. 2 shows results demonstrating the effect of increasing S for D=0.5 and 1. In order to isolate the influence of these two parameters, M, W, and f are all taken as negligibly small values and a/H=40, which is sufficiently large so that results for x/H<30 are not influenced by the specific value of a/H. The effect of the opening or suppression of the opening of HF1 induced by the growth of HF2 is thus shown to be a transition from attractive curving of HF2 for $S \lesssim 0.2$ to repulsive curving for $S \gtrsim 0.2$. No further change in the crack path occurs if S is increased to above 1, hence S≥1 is equivalent to the zero-opening, S→∞ limit. FIG. 3 shows that increasing W, in this case with S→0, has a similar effect of causing a transition from attractive to repulsive curving. Not surprisingly, the W→∞ solution, for which the opening induced on HF1 as HF2 grows is suppressed, produces almost the same crack path as the s→∞ for the same value of D.

Figure 4:
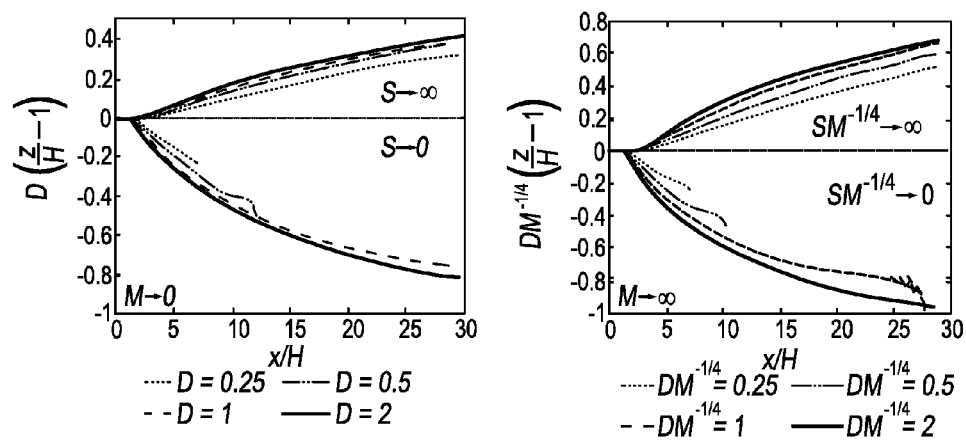
FIG. 4 illustrates scaled crack path deflection for toughness (left) and viscosity (right) dominated cases as a function of dimensionless deviatoric stress.

Returning to FIG. 2, the value of D is shown to determine the size of the "envelope" defined by the S→0 and s→∞ solutions. As D increases, the size of this envelope decreases, and in fact it scales by 1/D when $D \gtrsim 1$, as shown by the nearly complete convergence of the curves in FIG. 4. Note that it is convenient here to present the curving in terms of the scaled crack path deflection z/H−1. Furthermore, FIG. 4 shows that the viscosity dominated cases behave in essentially the same way to the toughness dominated cases but with the crack path determined by $DM^{-1/4}$. Hence, for negligible W and f, for D>1 and for S and M taking on either small or large values, the expected crack deflection can be obtained by a simple rescaling of the results in FIG. 4. For example, for a toughness dominated case with S→∞, the scaled (repulsive) deflection at, say, x/H=30 is given by 0.4/D.

Suppression of Sliding on HF1

Figure 5:
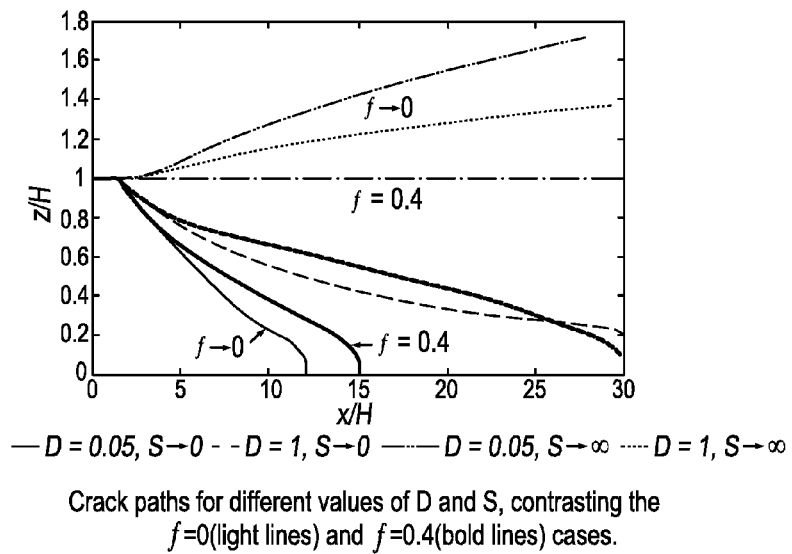
FIG. 5 illustrates crack paths for differing values of dimensionless deviatoric stress D and dimensionless confining stress S and for differing values of the coefficient of friction for sliding on HF1, contrasting the f=0 (light lines) and f=0.4 (bold lines) cases.

To this point consideration has been limited to frictionless contact along HF1. As the friction coefficient f is increased, naturally the ability of HF1 to sustain shear stress is also increased. FIG. 5 shows results for toughness dominated cases with W→0, for S→0 and S=2, and for two different values of D. Here the light-colored lines indicate the frictionless solution and the bold lines correspond to f=0.4 for S→0 the friction on HF1 has an observable effect, although qualitatively the deviation from the frictionless case is not significant. However, for large S, not only is the opening of HF1 suppressed, as before, but also the sliding. In the W→0 case shown in FIG. 5, HF2 does not curve for the f=0.4 conditions.

Figure 6:
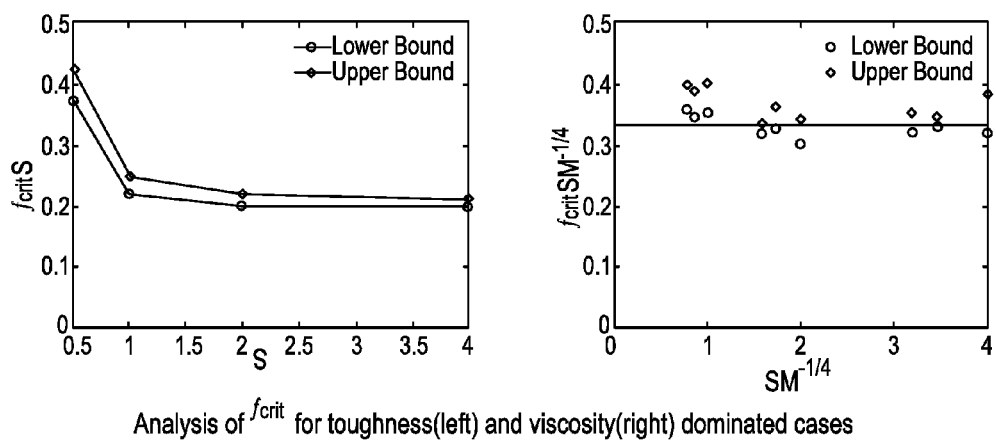
FIG. 6 provides an analysis of the critical value of the coefficient of friction as a function of dimensionless mean stress that prevents sliding on HF1 for toughness (left) and viscosity (right) dominated cases.

A question of practical importance is what characterizes the conditions under which HF1 neither opens nor slides. The answer is that, for given S or $SM^{-1/4}$, f must be greater than some critical value $f_{crit}$, which needs to be determined. Numerical simulations were used to bound this value from above and below, where the lower bound corresponds to conditions for a case in which HF2 curves and the upper bound corresponds to conditions in which HF2 does not curve. FIG. 6 shows these results for toughness and viscosity dominated cases. For the toughness dominated case, $Sf_{crit}$ approaches a constant value of about 0.21 for S>1.5. Hence, suppression of opening and sliding on HF1 is shown to correspond to f>0.21/S. Similarly, the value of $SM^{-1/4}f_{crit}$ attains a constant value for viscosity dominated case when $SM^{-1/4}>1.5$ and thus suppression of opening and sliding on HF1 for this case corresponds to $f>0.33/(SM^{-1/4})$.

These criteria for suppression of opening and sliding on HF1 were determined under the condition W→0. When W is finite, the value of $f_{crit}$ will be decreased. Hence, the criteria derived with W→0 are conservative. However, it should also be noted that the restrictions on W, as previously discussed, dictate that it will typically be much smaller than S so that its contribution to the normal stress along HF1, ergo the suppression of opening and sliding on HF1, will typically be second order.

Curving Under Elastic Conditions

Figure 7:
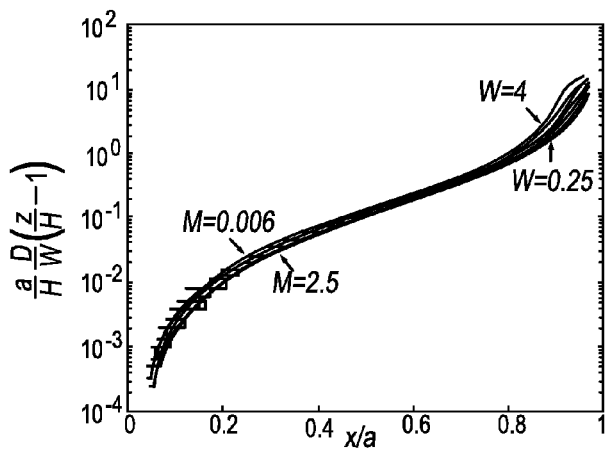
FIG. 7 provides a solution for scaled crack path deflection in an "elastic" case, which is the case when no sliding or opening of HF1 occurs.

While the role of W in suppression of opening and sliding on HF1 might be negligible relative to the role of S, it plays a central role in determining how much curving HF2 will undergo when it grows under elastic conditions. FIG. 7 shows the scaled repulsive elastic crack path deflection for HF2. A special scaling of the solution has been chosen in order to show that it is nearly self-similar. To demonstrate this property of the solution, the results from 20 simulations are shown together. Parameters vary considerably, with 30≤a/H≤60, 0.25≤W≤4, 0.5≤D≤2, and 0.006≤M≤2.5. In all cases the friction coefficient is chosen to satisfy the previously described criteria for suppression of opening and sliding on HF1. As shown, these cases all give nearly the same crack path when x is scaled by a and the deflection is scaled by aD/HW.

The variation from self-similarity appears for $\bar{w} \gtrsim 0.5$, which as previously discussed, may not typically correspond to realistic values anyway. Additionally, there is a small but discernable difference between the crack paths for the M=0.006 and M=2.5 cases. However, one must be cautious when interpreting this because for the viscosity dominated regime there is an apparent tension between the fact that the fracture toughness does not contribute to the final solution, that the crack growth is still determined by a fracture toughness based criterion in the model, and that the direction of propagation is also determined based on a calculation of the stress intensity factors. Hence, barring careful laboratory experimentation, it is difficult to ascertain whether the crack paths are appropriately determined by the model under viscosity dominated conditions. Nevertheless, previous model comparisons to laboratory data for near surface fractures gave excellent agreement, strongly suggesting the results presented here will hold up to experimental validation.

Before interpreting these results further, it is important to note that this self-similar solution represents the limiting case a/H→∞. Although the model is capable of exploring the variation of the solution as this inverse initial spacing parameter becomes smaller, it is consistent with the scope of the present paper to not present these details. For the present purpose, suffice it to say that numerical results show that the self-similar solution in FIG. 7 is valid over the region $x/a \lesssim 0.8$ when $a/H \gtrsim 8$. When $a/H \lesssim 8$, the self-similar solution provides an upper bound to the expected deflection and the deflection of HF2 essentially vanishes when it is far enough from HF1, which we found numerically to coincide with a/H ≈ 0.5.

When HF2 initiates close to HF1 and HF1 neither slides nor opens because of its interaction with HF2, an appropriate interpretation of the result presented in FIG. 7 is that the path of HF2 deflects away from HF1, with the deflection increasing in magnitude with increasing W, decreasing D, and with decreasing a/H. It is not surprising that W and D would have the respective roles of increasing and decreasing the amount of crack path deflection. However, it is surprising, at least initially, that the magnitude of the deflection increases with decreasing a/H. In other words, HF2 grows in a straighter path when it initiates closer to HF1.

Figure 8:
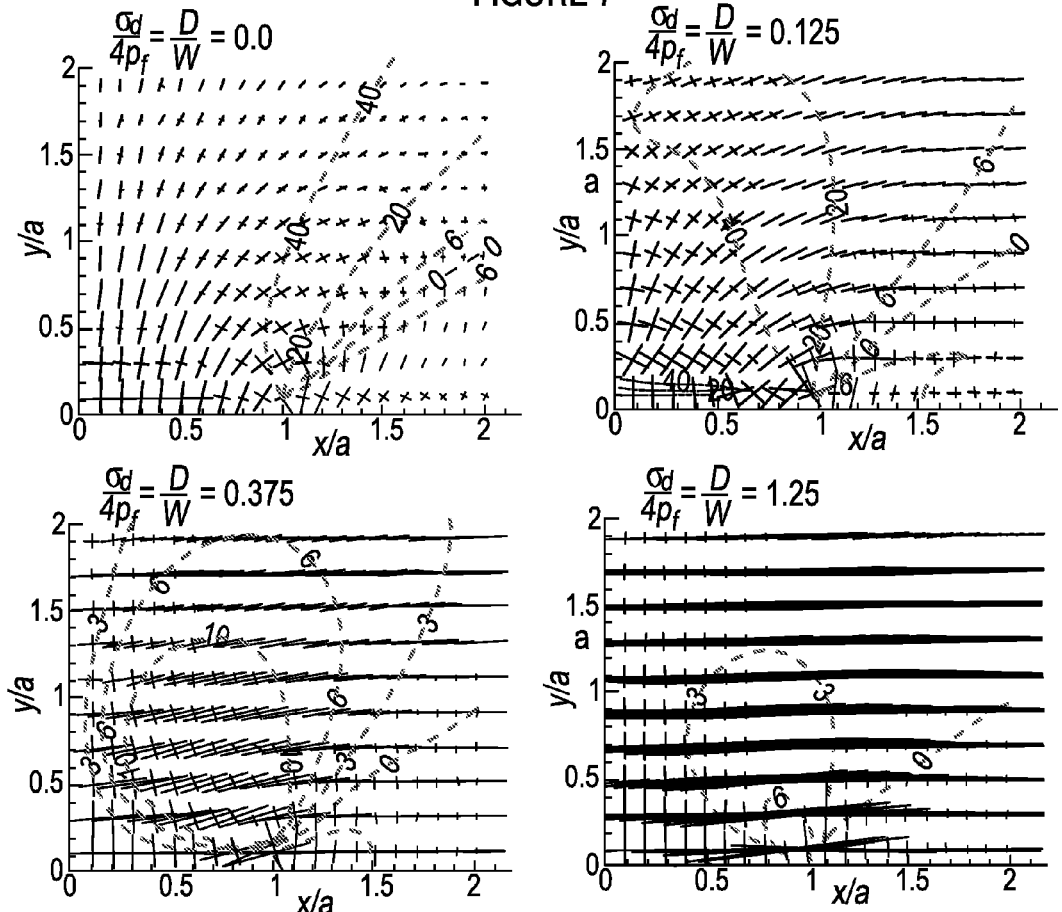
FIG. 8 illustrates principal stress vectors around a uniformly pressurised fracture, representing HF1, embedded in an elastic material for four values of D/W, the contours of the orientation of the maximum principal stress with respect to the x-axis direction being shown, with contours given in degrees and counter clockwise rotation positive.

Although the fact that the deflection of HF2 is actually smaller when it grows very close to HF1 than when it grows moderately close to HF1 may be initially surprising, it is actually not unexpected based on the to nature of the stress field induced by the propped HF1. In fact, the rotation of the principal stresses surrounding HF1, which drives the curving of HF2, vanishes both very close to and very far from HF1. The maximum rotation of the principal stresses exists in an intermediate region. In order to illustrate this point, we firstly note again that HF1 is propped with an elliptical opening, hence an identical opening profile can be produced by applying a uniform pressure, $p_f$, inside HF1. The internal pressure can then be defined in terms of $w_o$, E' and a as $p_f=w_o E'/4a$ and the ratio D/W, which forms part of the dimensionless parameter used to scale the y-axis of FIG. 7, can be expressed as $D/W=\sigma_d a/w_o E'=\sigma_d/4p_f$. Sneddon's (1946) solution for stress around a uniformly pressurized plane strain fracture is then used to obtain a map of the principal stress, shown in FIG. 8, for four values of D/W. The principal stresses are shown as stress bars with the magnitude indicated by the line length and the direction by its orientation. Compressive stresses are blue and tensile stresses are red. Contours of the orientation of the maximum principal stress with respect to the x-axis direction are superimposed on each plot. Fracture HF2 will grow along the direction of the maximum principal stress and will grow straighter with little deflection in regions where the contour value shown is small. FIG. 8 clearly shows that curving is reduced as D/W increases and that less curving is expected in a region near the x-axis and near the wellbore but curving should increase as H increases for decreasing a/H down to a value of about 1. In the case where a/H is smaller than 0.4, meaning HF1 and HF2 are far apart, no significant interaction or curving occurs. So, assuming no opening or sliding occurs on HF1 while HF2 extends, curving of HF2 is expected to be small for a region close to HF1 and for a region sufficiently far from HF1, with potential for curving for intermediate values of a/H.

A Note on the Application to Other Hydraulic Fracture Geometries

Before moving on to engineering implications, it is worth briefly discussing radially-symmetric, or penny-shaped hydraulic fractures that potentially curve to become saucer (or bowl) shaped. Indeed, for transverse hydraulic fractures growing from horizontal wells, this may be considered a more realistic simplification of the hydraulic fracture geometry. We note that the plane strain fracture geometry used in this study will provide a stronger mechanical interaction between HF1 and HF2 than would a 3D, penny-shaped, or PKN type geometry. The plane strain fracture opens with a constant width along its height direction and the additional opening stiffness Imposed by a fracture edge at the top and bottom of the fracture is not present. Therefore, the results presented in this specification should be conservative when compared to results from a more realistic 3D fracture geometry. A second difference when using a plane strain fracture geometry is that the injection rate is given per unit of fracture height. Therefore, the rules of thumb proposed in the next section use the volumetric injection rate $Q_o$ for the plane strain case which has dimension Length$^2$/Time, e.g. m$^2$/s, because it is taken per unit depth of the hydraulic fracture into the page in FIG. 1. A KGD fracture model is similar in this respect and a thickness or height of the 2D fracture must be specified to obtain the rate in m$^2$/s. For added realism, it would be ideal to have a model that considers radial symmetry rather than plane strain and this would be a natural and useful extension to this research. In the time being, we can propose the following hypotheses:

1. The crack paths for the radial and plane strain cases will be different, but not too different as shown by the comparison of plane strain and radial crack curving for near-surface hydraulic fractures presented by Vogel and Ballarini (1999). Furthermore, the stresses induced by a propped penny-shaped HF1 will be very similar to those induced in the plane strain case (Sneddon 1946).
2. The values of $f_{crit}$ will be different, but probably not substantially.
3. The form of the parameters S, D, and W will be unchanged.
4. For radial symmetry, the plane strain viscosity parameter M ought to be replaced by $$\overline{M} = \frac{\mu' E'^3 \overline{Q}}{HK'^4} \tag{8}$$

where $\overline{Q}$ is the true volumetric injection rate (dimension Length$^3$/Time). For a penny-shaped hydraulic fracture the importance of viscous dissipation diminishes as the injection time increases relative to a particular characteristic time (Detournay 2004). Following the approach used by Bunger (2005) for a near-surface hydraulic fracture, the quantity $\overline{M}$ compares this characteristic time with the characteristic time associated with the length of the hydraulic fracture increasing relative to H.

While confirmation of these points must wait for testing using an appropriate simulator, the engineering implications presented in the next section ought to be essentially transferable to penny-shaped and even more generally shaped hydraulic fractures provided that M (Eq. 5) is replaced with $\overline{M}$ (Eq. 8).

Engineering Implications

While there may be some cases where it is considered advantageous to design hydraulic fractures so that they are expected to curve and thus potentially coalesce with one another, typically it will be advantageous when the stimulation results in planar, or nearly planar hydraulic fractures. Closely spaced, planar fractures are expected to give the most stimulation effect because production will come equally from reservoir material on both sides of each hydraulic fracture. Also, planar hydraulic fractures are considerably easier to account for in reservoir models by using symmetry. And finally, an aggressive design of very closely spaced, planar hydraulic fractures could make some very low permeability reservoirs viable and could be useful in non-petroleum applications such as preconditioning ore bodies for block cave mining (van As and Jeffrey 2000), stimulating geothermal reservoirs, and stimulating ultramafic rocks for carbon storage through mineralization (Keleman and Matter 2008). This discussion is thus focused on application of the results from the parametric study in order to determine whether hydraulic fracture curving is negligible for a given set of input parameters.

Figure 9:
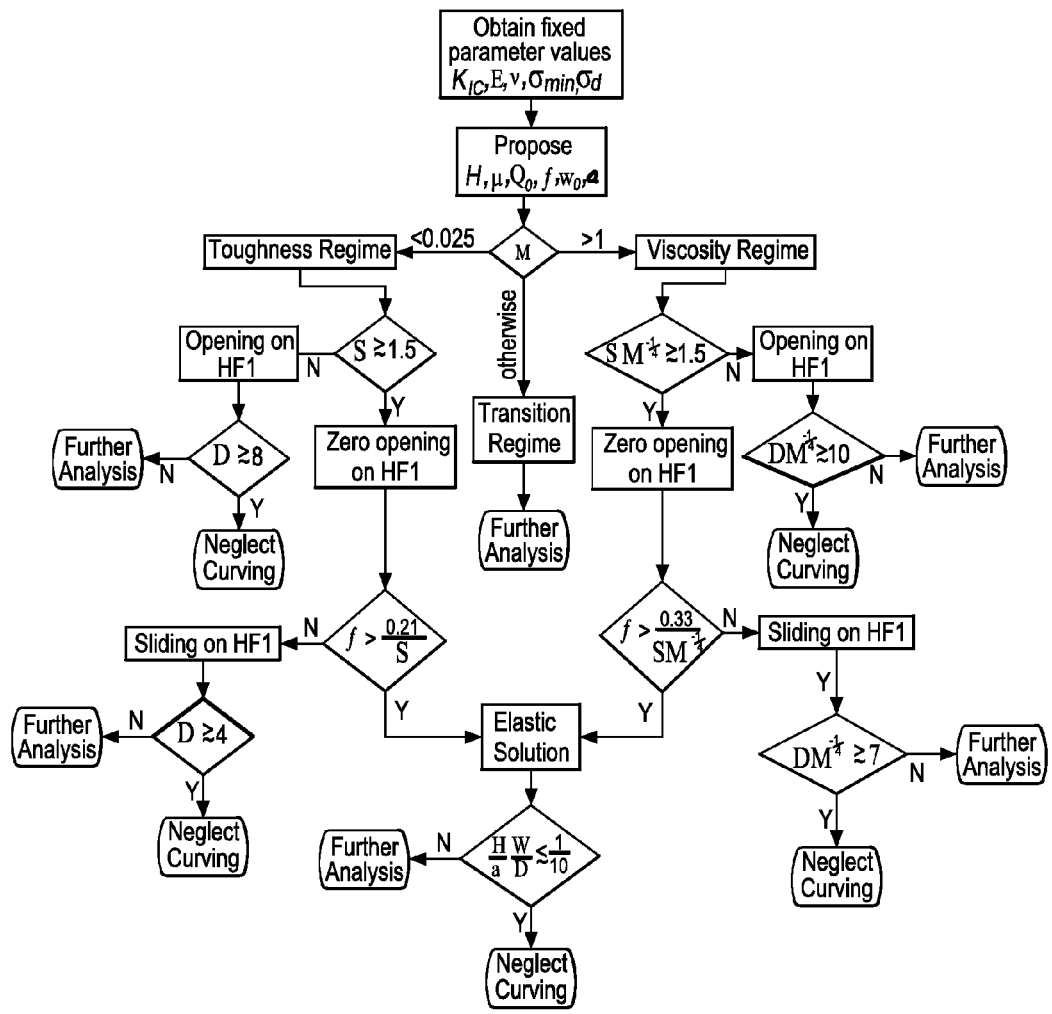
FIG. 9 charts a method for determining if a hydraulic fracture satisfies sufficient conditions for neglecting curving.

One approach to determining whether sufficient conditions are satisfied for curving to be neglected is summarized by the flow chart presented in FIG. 9. The procedure begins by determining the propagation regime: toughness dominated, viscosity dominated, or transitional between the two regimes. Curving can be suppressed in the transitional regime just as in the two extreme regimes, however, because the transitional regime is a relatively narrow range relative to M, it suffices for the present exercise to consider only the toughness and viscosity dominated cases.

The left half and right half of FIG. 9, corresponding to the toughness and viscosity dominated cases, respectively, are comprised of nearly identical checks and decision points. One difference is that D and S for the toughness dominated case are replaced by $DM^{-1/4}$ and $SM^{-1/4}$ in the viscosity dominated case. The other difference relies on the observation that the numerical values of the thresholds are a bit different. There is some room for choice in these threshold values, and in FIG. 9 they are chosen as follows:

The thresholds $S \gtrsim 1.5$ and $SM^{-1/4} \gtrsim 1.5$ for suppression of the opening on HF1 are chosen based on the discussion related to FIG. 1 and FIG. 6.

The thresholds $f > 0.21/S$ and $f > 0.33/(SM^{-1/4})$ for suppression of the sliding on HF1 are chosen based on the analysis relating to FIG. 6.

The thresholds on D and $DM^{-1/4}$ are based on FIG. 4 and are somewhat arbitrarily chosen to correspond to approximate minimum values for which HF2 will deflect 10% or less from its original plane by the time it reaches x/H=30.

The threshold $HW/\mathcal{M} \ \frac{1}{10}$ is based on FIG. 7 and is again somewhat arbitrarily chosen to represent the approximate maximum value this quantity can have for which HF2 will deflect 10% or less from its original plane by the time it reaches x/a=0.8. Recall that this predicted value of the deflection is valid for $a/H \gtrsim 8$ and will be conservative, i.e. an upper bound for $a/H \gtrsim 8$.

The flow chart in FIG. 9, then, has two possible outcomes: "Neglect curving" and "Further analysis". The outcome "Neglect curving" indicates that sufficient conditions have been satisfied so that in most cases planar hydraulic fracture growth is expected. The outcome "Further analysis" indicates that none of the particular sets of sufficient conditions considered in FIG. 9 are satisfied. Curving may still be negligible. In some cases, for example when opening on HF1 is suppressed but sliding is not and the deviatoric stress is not large enough to suppress the curving to the desired threshold, "Further analysis" can be obtained through examination of the data presented in this paper (i.e. FIG. 4 or, for the elastic cases FIG. 7). In other cases, for example when the value of M indicates that growth is in a transition regime, one would have to run the relevant cases on an appropriate hydraulic fracture growth simulator such as the one used in the present study.

Figure 10:
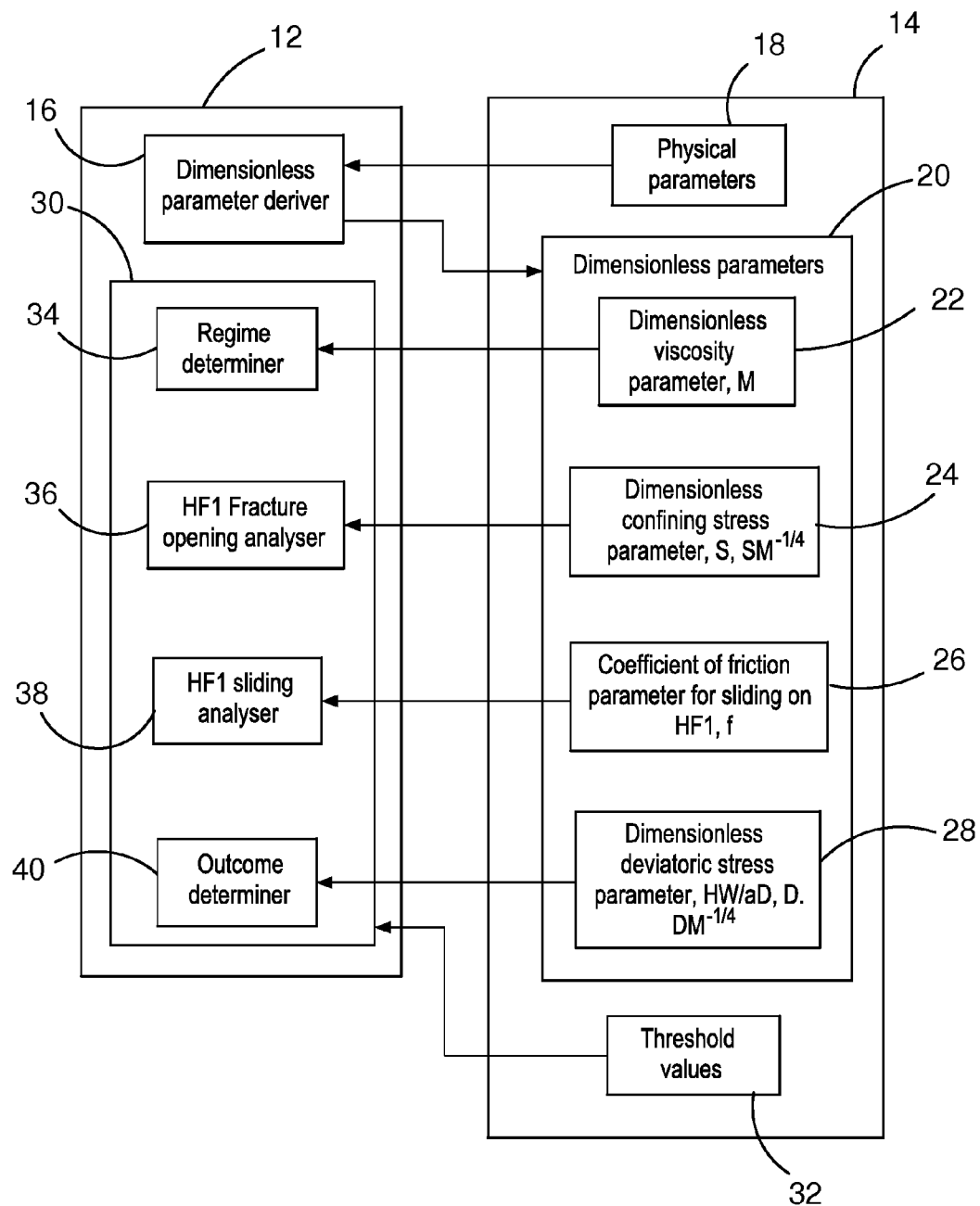
FIG. 10 illustrates diagrammatically apparatus for forecasting curvature of hydraulic fractures in accordance with the present invention.

Core functional components of an example apparatus for forecasting curvature of a hydraulic fracture to be initiated in the vicinity of one or more previously placed fractures along a bore hole are shown in FIG. 10.

In this example, the apparatus is implemented using a suitable computing device having a processor 12, associated static and temporary memory 14 for storing programs and data to be used by or produced by the processor, and associated peripheral devices such as a screen, keyboard and mouse.

The core components include a dimensionless parameter deriver 16 arranged to receive dimensional parameters 18 affecting the growth of a hydraulic fracture and to produce dimensionless parameters 20 selected as similarity parameters with respect to the shape of the hydraulic fracture path. In the present embodiment, the dimensionless parameters 20 include a viscosity parameter 22, a confining stress parameter 24, a coefficient of friction parameter 26, and a deviatoric stress parameter 28.

The core components also include a comparator 30 arranged to carry out structured comparisons between the dimensionless parameters and respective threshold values 32 and to use the comparisons to produce an indication of possible curvature of the hydraulic fracture path.

In this embodiment, the comparator 30 includes a regime determiner 34 arranged to determine whether the propagation regime is toughness dominated, viscosity dominated or transitional based on a comparison of the viscosity parameter 22 with respective viscosity parameter upper and lower thresholds; a HF1 fracture opening analyzer 36 arranged to determine whether an opening on HF1 exists based on a comparison of the confining stress parameter 24 with a respective confining stress parameter threshold; a HF1 sliding analyzer 38 arranged to determine whether sliding on HF1 or an elastic solution exists based on a comparison of the coefficient of friction parameter 26 with a respective coefficient of friction parameter threshold; and an outcome determiner 40 arranged to produce an indication that curving is unlikely or that further analysis is required based on a comparison of the deviatoric stress parameter 28 with a respective coefficient of friction parameter threshold.

In the present example, the dimensionless parameter deriver 16 and the comparator 30 are implemented using the processor 12 and associated programs stored in the memory 14, although it will be understood that other implementations are envisaged.

Laboratory and Field Examples

We conclude our discussion with examination of a few relevant laboratory and field examples. Specifically, we present qualitative comparisons between the expected curving behavior and the behavior reported in the literature for the Oak Ridge waste injection field experiments (de Laguna et al. 1968, Sun 1969, McClain 1970), an example for stimulation of horizontal wells in the Bakken formation of Montana and North Dakota (Olsen, et al. 2009, Wiley et al., 2004) and results of laboratory experiments on closely spaced fracture growth in granite blocks. Input parameters relevant to our model are reported in Table 1. Note that, following the discussion surrounding Eq. (8), M is computed using $Q_o = \overline{Q}/H$, where H is the spacing between fractures (it should not be confused with the fracture height as used in KGD-type fracture) and hence it is equivalent to $\overline{M}$ from Eq. 8. Selection of parameters and comparison between the predictions and observations are presented in the following.

Oak Ridge Field Experiments

Hydraulic fracturing experiments that consisted of slurry injection into a shale formation at 260-290 m depth were carried out by Oak Ridge National Laboratory in the early 1960s to investigate a novel method for radioactive waste disposal. "Fracturing Experiments 1 and 2" (de Laguna et al. 1968, Ch. 3) have received some discussion in the literature (e.g. Sun 1969, McClain 1970). These were initiated about 70 m apart and grew approximately parallel to one another to more than 100 m in extent. However, of greater relevance to our model predictions are "Experimental Injections 1 to 5" (de Laguna et al. 1968, Ch. 7). These were initiated from a slotted casing with spacing ranging from 3 to 6.4 m. Observation wells were drilled with core taken after the hydraulic fractures were placed and these, combined with gamma logs of the observation wellbores, provide details of the location of the hydraulic fractures at various points ranging from 30 to 46 m from the injection well. Here we look at two sets of interactions: between Injection 1 and the subsequent Injection 2, and a pair of apparently quite similar interactions corresponding to interaction between Injection 4 and the previous Injection 3, and between Injection 5 and the previous Injection 4. Note that for the moment we are adopting the model assumption that we can understand the basics of fracture growth by considering only the interaction with the nearest, previously placed hydraulic fracture, although it is clear

TABLE 1

Summary of comparison with laboratory and field experiments, where * indicates an assumed parameter value.

| Parameter Values | ORNL Injections 1-2 | ORNL Injections 3-5 | Bakken Fracture |
|---|---|---|---|
| $\sigma_{min}$ (MPa) | 7.5 | 7.5 | 55 |
| $\sigma_d$ (MPa) | 0.5-1* | 0.5-1* | 4 |
| E (MPa) | 18000* | 18000* | 40,000 |
| v | 0.1* | 0.1* | 0.25 |
| $K_{Ic}$ (MPa m1/2) | 0.7* | 0.7* | 1.0 |
| f | Assume >0.02 | Assume >0.03 | Assume >0.5 |
| μ (Pa s) | 0.003 | 0.005-0.01 | 0.150 |
| Q (m3/s) | 0.0017 | 0.0017 | 0.132 (30 m payzone) |
| H (m) | 6.4 | 3 | 26 |
| a (m) | ~80 | ~100 | 125 |
| $w_o$ (m) | 0.009 | 0.009 | 0.004 |
| Calculated Values | | | |
| M | 2.3 | 13 | 5929 |
| $SM^{-1/4}$ | 22 | 10 | 32 |
| $DM^{-1/4}$ | 1.5-3 | 0.65-1.3 | 2.32 |
| HW/aD | 0.16-0.3 | 0.05-0.1 | 0.07 |
| Model Prediction | Repulsive deflection 0.03 < z/H-1 < 0.06 at x/a = 0.5 | Nearly parallel, slight repulsive deflection with z/H-1 < 0.1. | Nearly parallel, with z/H-1 = 0.05 at x/a = 0.8 |
| Observation | Repulsive deflection of z/H-1~0.2 at x/a~0.5 | Parallel to resolution of the measurements (+/− 1 m) | No direct measurements available for this completion. | that several previous hydraulic fractures placed in close proximity could have an influence on a given hydraulic fracture's growth.

Figure 11:
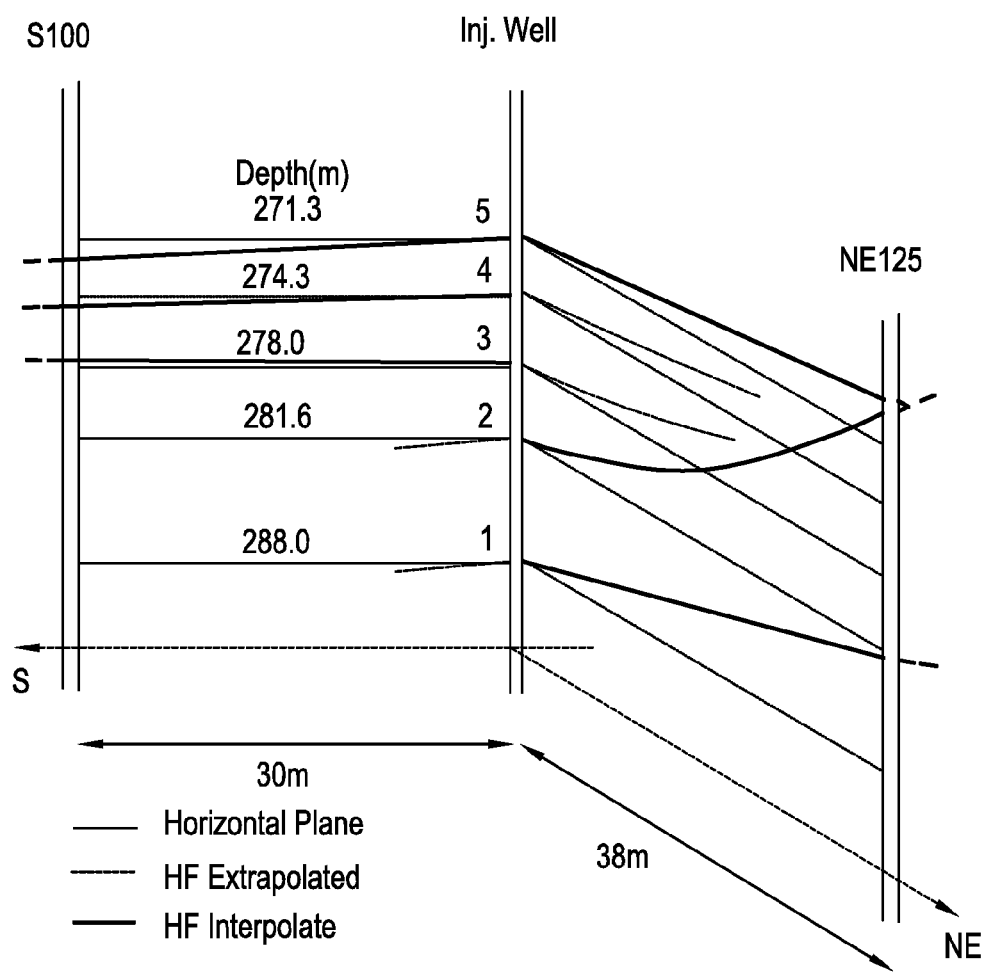
FIG. 11 shows an interpretation of measured fracture curving and fracture location data reported by Oak Ridge National Laboratory that is consistent with the invention.

FIG. 11 shows a sketch that comprises our interpretation of the observation well intersection data reported by de Laguna et al. (1968). It shows two implied cross sections associated with the core logs from well S100, located 30 m to the south of the injection well, and well NE125, located 38 m to the northeast of the injection well. No correction is made for possible deviation of the observation wells, and when there is a small discrepancy between the depth from gamma logs and core logs (~1 m), the core log depths are used, which is consistent with the original authors' convention. The image that emerges is of Injection 1 dipping at about 9 degrees to the southwest, with Injection 2 deflecting away from it (upward) by 6 m by the time it reaches observation well NE125. Both fractures apparently terminate, in the cross section we consider, between the injection well and 5100, where they are not observed. Injections 3 and 4, on the other hand, are essentially parallel and horizontal (in this cross section) up to the resolution of the logs. These two fractures are observed in 5100 but not NE125, perhaps because of the influence of the previously-placed and apparently deflected Injection 2. Injection 5, which had an injected volume approximately 4 times greater than the other fractures, is seen in both observation cores, suggesting that it dips to the southwest at about 5 degrees and is parallel in cross section to Injections 3 and 4 between the injection well and 5100.

A couple of caveats are in order. Firstly, the bedding planes of the shale formation in which these fractures were created are reported to have very low tensile strength. This was not quantified and hydraulic fractures were in fact observed in several cases to grow in orientations suggesting that they crosscut the bedding. Nonetheless, this strength anisotropy has been suggested to provide a significant, even dominant role in determining hydraulic fracture orientation (de Laguna et al. 1968). Furthermore, it has been suggested that there may have been some obstacle, such as a tightly folded section of rock, located approximately 30 m North of the injection well that impeded or deflected growth in that direction (de Laguna et al. 1968, pg. 194). And so it is conceded that comparison with our model which is for homogeneous and isotropic rocks, may not be strictly appropriate. Furthermore, the rock properties and deviatoric in situ stress have to be assumed; as do the length of the fractures which are taken roughly based on the solution for a penny-shaped, viscosity dominated hydraulic fracture (e.g. Savitski and Detournay 2002). Note that we have used the same handbook values for E and v as in Sun (1969) for the same field site and the value of $K_{Ic}$ is a guess that fortunately has little bearing on the model prediction because it appears that these fractures are clearly in the viscosity dominated regime. These and other parameter values, which were ascertained from de Laguna et al. (1968), are given in Table 1 along with the computed values of the dimensionless parameters relevant to our analysis.

Both issues, that rock heterogeneity or anisotropy could substantially influence fracture growth and that a number of parameters may be poorly constrained, will be common problems for comparison with most field data. This comparison is no exception. Nonetheless, there are some intriguing consistencies between data from the Oak Ridge Experimental Injections and the model predictions. The model predicts that in these cases the previously placed hydraulic fracture will neither open nor slide, and therefore propagation is in the "elastic regime", discussed above (e.g. FIG. 8). Hence, curving will be related to HW/aD. For Injections 3 to 5 this quantity is small enough that it implies that the hydraulic fractures should be nearly parallel, which they were found to be based on the two intersecting wells. On the other hand, the deflection of Injection 2 away from the previous Injection 1 is stronger than for Injections 3 to 5. This observation is consistent with HW/aD being larger for Injections 1 and 2 owing mainly to the larger spacing between the initiation slots. It is interesting to see that this deflection may have had an important impact on the geometry of subsequent fractures, as it is plausible that upward deflection of Injection 2 contributed to the fact that Injections 3 and 4 appear to have favored growth to the south and were presumably impeded in their growth to the northeast. Hence, in spite of the uncertainties surrounding comparison between our model and these field experiments, this discussion demonstrates both encouraging consistency between model predictions and field data and the usefulness of the model for aiding interpretation of field data.

Bakken Example

The Bakken Formation is produced primarily by long horizontal wells that are stimulated by hydraulic fracturing. The fractures are typically placed along the horizontal wellbore with a designed spacing between fractures ranging from several hundred to somewhat less than 100 m. However, the vertical fractures placed often grow at an angle to the wellbore axis so that the perpendicular distance between adjacent fractures is reduced. Recent results from fracture monitored using microseismics provide an example of this type of growth with the fractures in that case growing in the maximum stress direction at an angle of 36° to the wellbore axis (Olsen et al. 2009). Stimulation of wells drilled along the maximum stress direction is designed to create a single hydraulic fracture aligned with the wellbore. However, the maximum stress direction is not known to an accuracy of better than 10° and the well axis may not be drilled exactly in the intended direction. Both of these factors mean the wellbore may differ from the stress direction by more than 10°. For example, Wiley et al. (2004) give an example of such a completion where the fractures were to be placed at intervals of approximately 500 ft (150 m) along the well. Assuming the fractures did initiate with this spacing along the well, the perpendicular distance between adjacent fractures if the wellbore was misaligned with the stress by 10° would be about 26 m. A similar configuration will be considered here as an example because such closely spaced fractures might be expected to not grow parallel. Stress and rock properties have been taken from Wiley et al. (2004) and from Cramer (1992), but it is fair to say that the values of the maximum and minimum horizontal principal stresses are not well known, although they are generally considered to only differ from one another by a few hundred psi. Therefore, 4 MPa of stress difference is used in the example calculation given here. The formation, well and injection parameters are listed in Table 1, together with the calculated dimensionless parameters used for assessing the potential for fracture curving. The analysis, using the flow chart in FIG. 9 and the graph in FIG. 7 proceeds as follow:

1. $\mathcal{M}$ is calculated as 5929 which is larger than 1. Therefore, branch to the right side of the flowchart for viscous dissipation dominated cases,
2. $\mathcal{S}\mathcal{M}^{-1/4}$ is calculated and, in this case, is equal to 32 which is larger than 1.5. Therefore, opening along HF1 is not expected.
3. $0.33/(\mathcal{S}\mathcal{M}^{-1/4})$ is calculated as 0.01, which is smaller than the assumed coefficient of friction value of 0.5, meaning that sliding on HF1 is not expected.
4. Finally, $H_W/aD$ is calculated as 0.07 which is less than 0.1 implying that curving of the HF2 will be small enough that it can be neglected. Note that $H_W/aD$ and thus the self-similar solution in FIG. 7 gives an upper bound to the amount of deflection so that the actual expected curving is less than what is calculated here.

The conclusion of the analysis for this Bakken fracture case is that the fracture growth will be dominated by viscous dissipation with no frictional slip or opening anticipated to occur on HF1 because of the growth of HF2. Furthermore, HF2 is not expected to curve away from HF1 significantly. No data exists for this case on the amount of curving that did or did not occur, but the procedure for estimating curving from field data has been illustrated by presenting it here. Once a value of $H_W/aD$ is obtained, FIG. 7 can be used to estimate the deflection of HF2 along the half-length of HF1. This is done by selecting an x/a point along fracture HF2 where the deflection is to be estimated. Then moving vertically in FIG. 7 from that x/a value until the curve is reached provides, by reading the corresponding value from the y-axis, a numerical value for aD/HW(z/H−1). Because all of the parameters in this nondimensional term are known except for the deflection z/H−1, this quantity can be readily obtained.

Laboratory Experiments on Closely Spaced Fracture Growth Apparatus and Design

Experiments were performed in 350×350×350 mm blocks of a medium grained gabbro marketed as Adelaide Black Granite. The specimens are prepared by drilling a 16 mm diameter hole to a depth of 290 mm, after which a diamond coated steel tooth is used to scribe 4 notches of 1 mm depth around the circumference of the hole. These notches are separated by spacing H, indicated in Table, and the notch array is centered relative to the top and bottom of the block. After machining, each specimen is placed in a polyaxial confinement cell where water-filled stainless steel flat jacks connected to a syringe pump apply equal horizontal (maximum) stresses and a smaller vertical (minimum) stress as listed in Table 2.

TABLE 2

Governing parameters and values for laboratory experiments (Blocks 3, 4, and 6)

| Symbol | Parameter | Block 3 | Block 4 | Block 6 |
|---|---|---|---|---|
| H | Fracture spacing | 0.015 m | 0.015 m | 0.025 m |
| E | Young's Modulus | 102 GPa | 102 GPa | 102 GPa |
| v | Poisson's Ratio | 0.27 | 0.27 | 0.27 |
| $K_{Ic}$ | Mode I rock fracture toughness | 2.3 MPa m1/2 | 2.3 MPa m1/2 | 2.3 MPa m1/2 |
| μ | Dynamic viscosity of the fluid | 0.58 Pa s | 0.58 Pa s | 0.58 Pa s |
| $Q_o$ | Injection rate | 0.19 ml/min | 0.19 ml/min | 0.19 ml/min |
| f | Rock/proppant friction coefficient | >0.5 (guess) | >0.5 (guess) | >0.5 (guess) |
| $w_o$ | Max. propped opening of HF1 | <0.01 mm (guess) | <0.01 mm (guess) | <0.01 mm (guess) |
| a | Half length of HF1 | 0.17 m | 0.17 m | 0.17 m |
| $\sigma_{min}$ | Minimum in situ stress | 0 MPa | 0 MPa | 14.4 MPa |
| $\sigma_d$ | Differential stress between maximum and minimum | 4.6 MPa | 4.6 MPa | 3.6 MPa |

The first hydraulic fracture is created by setting a small isolation tool across the bottom notch so that injection is isolated between o-ring seals that are approximately 5 mm above and 5 mm below the bottom notch. The fracturing fluid, comprised of a solution of water, blue food dye, and glycerin, is delivered to the isolated zone around the slot through stainless steel tubing, connected to a positive displacement stepping motor pump.

The pressure is monitored in the injection line. As the fluid is injected the pressure increases. After the fracture begins growing, the pressure begins to decline. Once the peak, or breakdown pressure is reached, injection continues for 60 seconds, after which the pressure is shut-in for 15 minutes, followed by a reversal of the pumping in order to relieve the pressure. The isolation tool is then moved to the notch immediately above, and the injection procedure repeated. In this way four sequential hydraulic fractures are generated. After all four fractures have been created, the specimen is removed from the confining apparatus and sawn in half in order to permit photography and measurement of a cross section of the fracture paths' geometries.

The experiments presented here are designed so that hydraulic fracture growth is in the toughness dominated regime, with M<0.001 in all cases. The values of the remaining dimensionless groups, using the toughness-dominated formulae, are as designated in Table 3.

TABLE 3

Dimensionless similarity groups and interpretation, along with values for the experiments presented in this paper. Note this is a slightly different presentation that does not alter the more detailed Bunger et al. [14].

| Similarity Group For M < 0.025 | For M > 1 | Physical Interpretation | Influence on curving interaction | Blk 3 | Blk 4 | Blk 6 |
|---|---|---|---|---|---|---|
| $S = \dfrac{\sigma_{min}\sqrt{H}}{K_{Ic}}$ | $SM^{-1/4} = \dfrac{\sigma_{min}\sqrt{H}}{(\mu Q_0 E'^3)^{1/4}}$ | Ratio of minimum stress to fracture induced stress | Tensile stress opening HF1 suppressed when approx. >1 | 0 | 0 | 1.0 |
| fS | $fSM^{-1/4}$ | Resistance to sliding of HF1 | Sliding on HF1 suppressed when >0.21 (toughness regime) or >0.33 (viscosity regime) | 0 | 0 | >0.5 |
| $D = \dfrac{\sigma_d\sqrt{H}}{K_{Ic}}$ | $DM^{-1/4} = \dfrac{\sigma_d\sqrt{H}}{(\mu Q_0 E'^3)^{1/4}}$ | Ratio of differential stress to fracture induced stress | Curving usually suppressed when approx. >10 | 0.25 | 0.25 | 0.25 |
| $\dfrac{w_0 E' H}{a^2 \sigma_d}$ | $\dfrac{w_0 E' H}{a^2 \sigma_d}$ | Relative magnitude of deflection due to stresses around propped HF1 | Curving due to propped HF1 can be neglected if approx. <0.1 | <0.1 | <0.1 | <0.2 |
| a/H | a/H | Relative length of HF1 | Determines overall geometry | ~11 | ~11 | ~7 |
| v | v | Poisson's ratio | Small effect | 0.27 | 0.27 | 0.27 |

The experiments are designed to test two limiting regimes predicted by the model:
- zero minimum stress
- minimum stress that is sufficient to completely suppress reopening of HF1 as HF2 grows.

Figure 12:
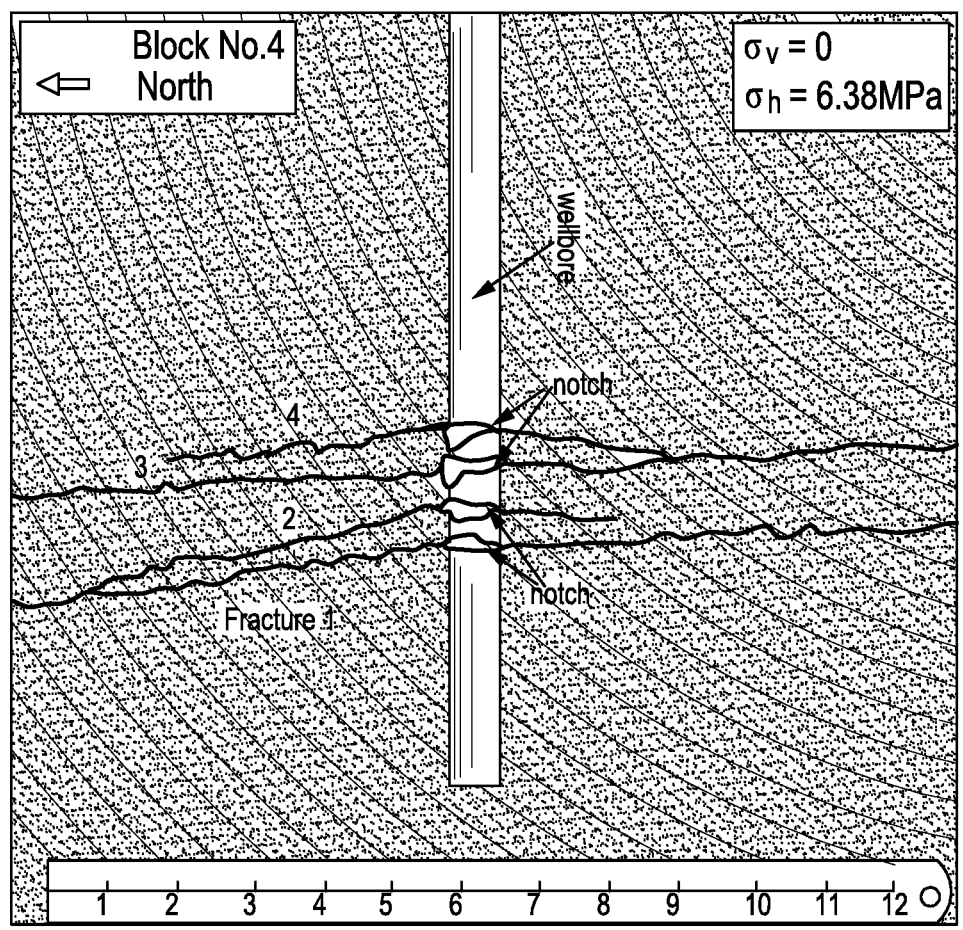
FIGS. 12 to 14 illustrate development of fractures in laboratory experiments performed on blocks of medium grained gabbro marketed as Adelaide Black Granite.
Figure 13:
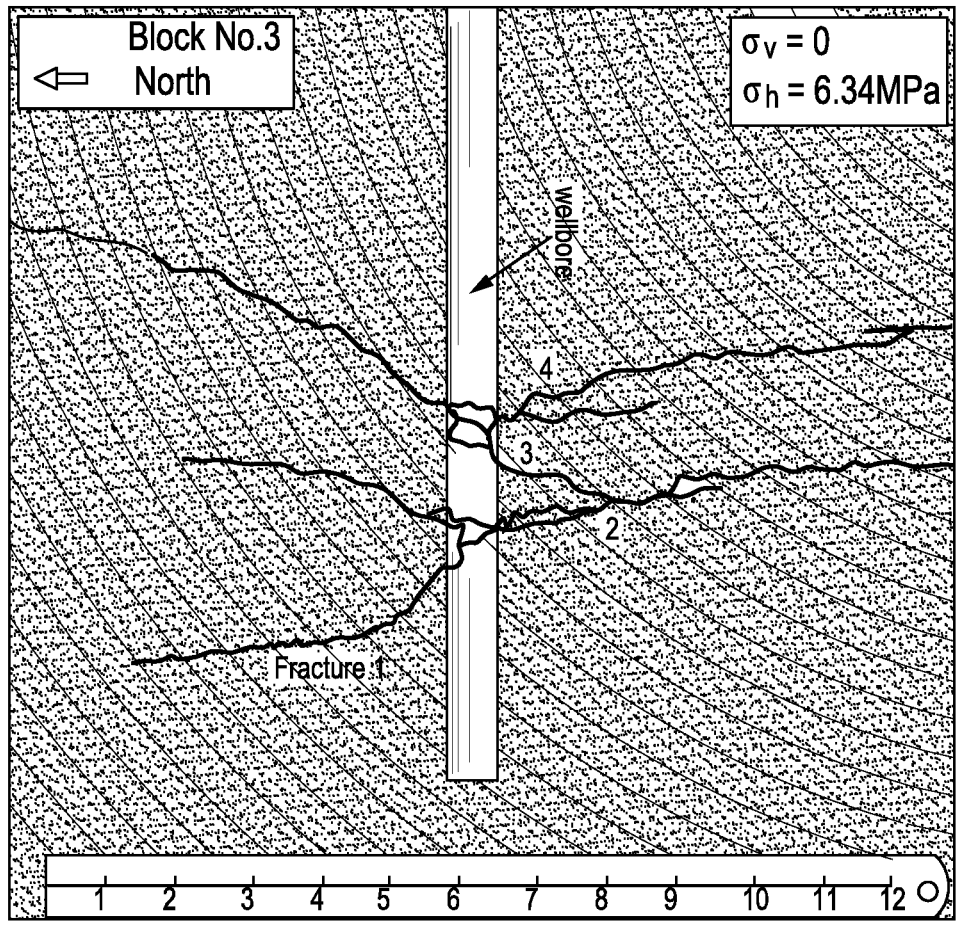
Figure 14:
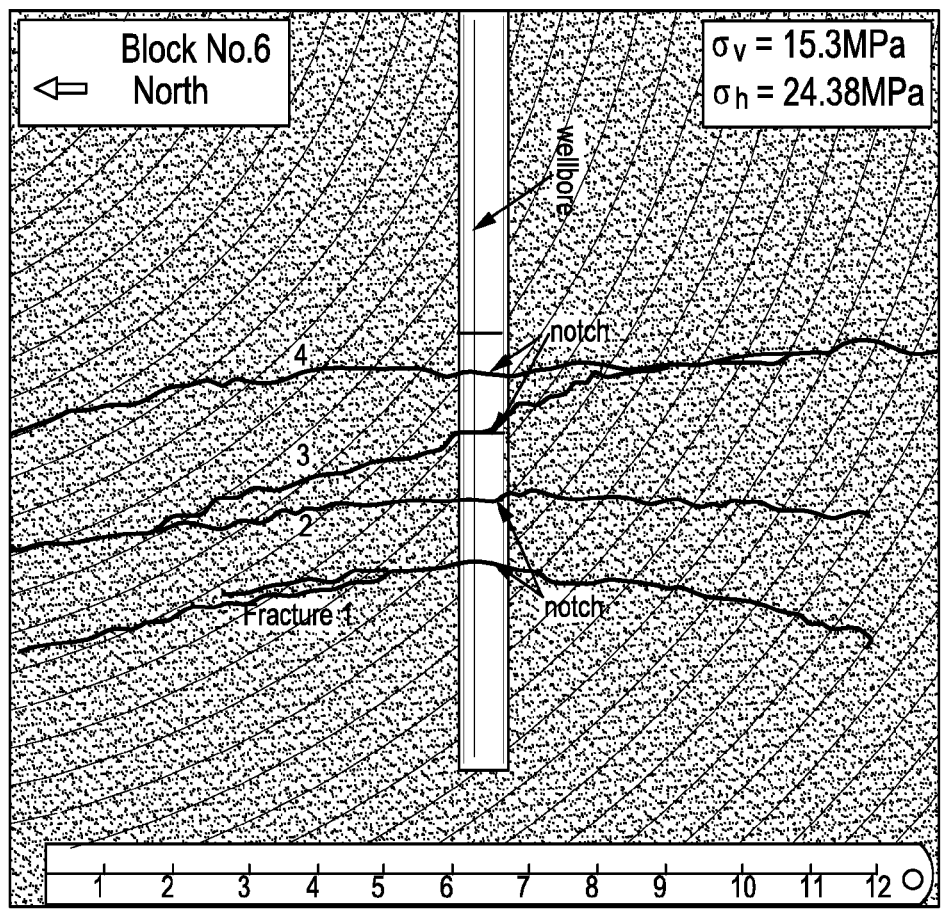

In the former case we contrast a notched (Block 4 illustrated in FIG. 12) and unnotched case (Block 3 illustrated in FIG. 13), while in the latter we present a case for a notched borehole only (Block 6 illustrated in FIG. 14).

Breakdown Pressure

Coupled with the effect of the notching is a possible influence of the elapsed time between fractures (Table 4, "Relative Time"). This rock is essentially impermeable on the timescale of the experiments, and no evidence of leakoff is observed. However, in the absence of proppant, the residual width of each fracture will be expected to decrease for some time after each experiment is completed as viscous fluid slowly flows back to the borehole. Table 4 shows that, for these experiments, the increase in breakdown pressure could also be mitigated by increasing the wait time between experiments.

TABLE 2

Breakdown pressure and relative time for each fracture (stage) of the laboratory experiments

| Frac # | Blk 3 MPa | Rel time (hours) | Blk 4 (MPa) | Rel time (hours) | Blk 6 MPa | Rel time (hours) |
|---|---|---|---|---|---|---|
| 1 | 28.6 | 0.0 | 25.1 | 0 | 39.8 | 0 |
| 2 | 29.4 | 1.1 | 23.3 | 47.4 | 39.3 | 21.9 |
| 3 | 32.3 | 1.9 | 25.9 | 48.1 | 45.6 | 46.1 |
| 4 | 36.3 | 2.8 | 26.9 | 48.8 | 44.5 | 69.7 |

Observed Fracture Paths

For the case of block 4 with S→0 and D=0.25, the model predicts that a fracture will curve toward a previous fracture, coalescing with it at a distance of about 7 times the initial spacing H. FIG. 10 shows a cross section of the fracture geometry created in block 4. The left side of fracture 2 (bearing in mind these are cross sections of quasi-circular fractures) coalesces with fracture 1 at about 9H. Similarly, the right side of fracture 4 coalesces with fracture 3 at about 4.5H. On average, this is close to the model prediction of 7H. It is also interesting to observe that not only was fracture 1 approximately planar, as expected, but so also was fracture 3.

Recall that block 6 differs from block 4 in that the minimum stress is increased so that S=1. FIG. 14 shows a cross section of the fracture paths created in block 6. On close inspection, we believe that notch 3 may have been inadequate, leading to the peculiar path of fracture 3. However, with this exception only, the fractures propagated in a nearly planar and parallel geometry, which is consistent with model predictions.

Role of Wellbore Notching

Block 3 is the same as the previously presented block 4 (FIG. 12) except that no mechanically machined notch is created so that the fracture initiated from an isolated 10 mm section of smooth wellbore. Inspection of a cross section of block 3 (FIG. 13) reveals significantly different fracture behaviors from block 4. Near the wellbore the complexity of the fractures that formed indicates that breakdown was not a straightforward process. This complexity persists as the fractures grow, resulting in deviated paths and more branching than in the notched block 4. The fractures also appear to interact strongly with each other. The result is a more complex fracture pattern, which some suggest may, at least under some circumstances, be beneficial to gas production. However, it is also clear that this complexity is to the detriment of uniformity; much larger sections of unfractured rock exist between the fractures in the unnotched case than in the notched cases. This loss of uniformity could be detrimental to the effectiveness of the treatment, whether the purpose is to provide access to gas reservoir rocks or to precondition an ore body to promote caving and fragmentation. Moreover the breakdown pressure increased the most strongly and systematically from one fracture to the next in this unnotched case. This suggests that notching the wellbore is expected to promote both uniformity of access to the formation and lower breakdown pressures, particularly as additional fractures are created.

CONCLUSIONS

When in situ stress conditions favor hydraulic fracture growth transverse to the wellbore, placement of multiple fractures can provide an effective method for connecting the wellbore to a large volume of the reservoir. It is usually desired, and almost invariably assumed, that these closely spaced hydraulic fractures will be planar and essentially parallel to one another. However, results from numerical modeling and experiments in both the laboratory and field, indicate that a hydraulic fracture path can often be deflected by interaction with a previous, nearby hydraulic fracture. The practically relevant question, then, is twofold: Under what conditions are closely spaced hydraulic fractures expected to be planar and parallel, and how can engineering decisions impact on fracture path curving in order to minimize it through design? We have devised a response to these questions through identifying a set of dimensionless similarity parameters that govern the fracture paths, investigating the influence of these parameters using a 2D hydraulic fracture growth simulator, and distilling the results to create a flow chart for evaluation of the predicted importance of hydraulic fracture curving for given conditions.

Fracture curving is suppressed provided that opening and sliding along the previously placed hydraulic fracture is suppressed, and provided that the stress disturbance due to the propping of the previous fracture is not too large. Determining whether these conditions are satisfied can often be a straightforward matter of computing the values of some similarity parameters and comparing these with numerically determined threshold values. When conditions for suppression of curving are not strictly satisfied, it is still possible to rapidly predict the curving behavior by applying the numerical results for curving fracture paths, which are presented in terms of similarity parameters, to different cases through scaling arguments. This approach for analyzing hydraulic fracture growth and interpreting data is demonstrated and shown to be useful for qualitatively constraining the expected crack paths by comparison with published field experiments. Through this comparison, we find for the range of conditions that are applicable to many field sites, curving of closely spaced hydraulic fractures is not expected to be significant and an array of closely spaced and nearly parallel propped fractures can be placed.

Nomenclature

| | | |
|---|---|---|
| E | Young's modulus of rock | MPa |
| $K_{Ic}$ | Rock fracture toughness | MPa |
| {X, Z} | Vectors of coordinates defining fracture path | $\sqrt{m}$ |
| x | x coordinate of a point | m |
| z | z coordinate of a point | m |
| $p_f$ | Pressure in the fracture, | MPa |
| $Q_0$ | Injection rate per unit thickness | m²/s |
| H | Initial perpendicular distance between fractures | m |
| f | Coefficient of friction for sliding on HF1 | |
| $f_{crit}$ | Critical value of f that prevents sliding on HF1 | |
| $w_0$ | Propped or residual width of HF1 | m |
| a | Half-length of HF1 | m |
| HF1 | Hydraulic facture 1, which is already present before HF2 is placed | |

-continued

| | | |
|---|---|---|
| HF2 | Hydraulic fracture 2, placed after HF1 | |
| $\sigma_{min}$ | Minimum principal stress | MPa |
| $\sigma_{max}$ | Maximum principal stress | MPa |
| $\sigma_d$ | Stress difference. = $\sigma_{max} - \sigma_{min}$ | MPa |
| $\mu$ | Fluid dynamic viscosity | Pa s |
| $\mu'$ | Fluid dynamic viscosity including a constant. = $12\mu$ | Pa s |
| $\nu$ | Poisson's ratio of rock | |
| D | Dimensionless deviatoric stress. = $\sigma_d \sqrt{H}/K_{Ic}$ | |
| S | Dimensionless minimum far-field stress. = $\sigma_{min}\sqrt{H}/K_{Ic}$ | |
| M | Dimensionless viscosity. = $\mu' E'^3 Q_o / K'^4$ | |
| W | Dimensionless propped width of HF1. = $w_o E'\sqrt{H}/(K_{Ic}a)$ | |
| K' | Rock fracture toughness including some constants = $(32/\pi)^{1/2} K_{Ic}$ | MPa $\sqrt{m}$ |
| E' | Plane strain Young's modulus of rock = $E/(1 - \nu^2)$ | MPa |

References

Abass, H. H., Soliman, M. Y., Tahini, A. M., Surjaatmadja, J., Meadows, D. L., and Sierra, L. 2009. Oriented fracturing: A new technique to hydraulically fracture an openhole horizontal well. In Proceedings SPE Annual Technical Conference and Exhibition. New Orleans, La., USA. SPE 124483.

Adachi, J. 2001. Fluid-Driven Fracture in Permeable Rock. Ph.D. thesis, University of Minnesota, Minneapolis, Minn.

Barenblatt, G. 1996. Scaling, Self-Similarity, and Intermediate Asymptotics, volume 14 of Cambridge Texts in Applied Mathematics. Cambridge UK: Cambridge University Press.

Berchenko, I. and Detournay, E. 1997. Deviation of Hydraulic Fractures through Poroelastic Stress Changes Induced by Fluid Injection and Pumping, Int. J. Rock Mech. Min. Sci. 14 (6), 1009-1019.

Buckingham, E. 1914. On physically similar systems; illustrations of the use of dimensional equations. Physical Review, 4(4), 345-376. APS. Retrieved from http://link.aps.org/doi/10.1103/PhysRev.4.345.

Bunger, A. P. 2005. Near-Surface Hydraulic Fracture. Ph.D. thesis, University of Minnesota, Minneapolis, Minn.

Bunger, A., Jeffrey, R., and Detournay, E. 2008. Evolution and morphology of saucer-shaped sills in analog experiments. In K. Thompson and N. Petford, editors, Structure and Emplacement of High-Level Magmatic Systems, volume 302, pages 107-118. London: Geological Society.

Carbonell, R., Desroches, J., and Detournay, E. 1999. A comparison between a semi-analytical and a numerical solution of a two-dimensional hydraulic fracture. Int. J. Solids Struct. volume 36 (31-32): 4869-4888.

Cramer, D. D. 1992. "Treating-Pressure Analysis in the Bakken Formation." JPT, January (1992): 20-26.

Crosby, D. G., Rahman, M. M., Rahman, M. K., and Rahman, S. S. 2002. Single and multiple transverse fracture initiation from horizontal wells. Journal of Petroleum Science and Engineering volume 35 (3-4): 191-204. doi: DOI: 10.1016/S0920-4105(02)00243-7.

Crouch, S, and Starfield, A. 1983. Boundary Element Methods in Solid Mechanics. London: Unwin Hyman.

de Laguna, W., Struxness, E. G., Tamara, T., McClain, W. C., Weeren, H. O., and Sexton, R. C. 1968. Engineering development of hydraulic fracturing as a method for permanent disposal of radioactive wastes. Technical Report ORNL-4259, Oak Ridge National Laboratory, Oak Ridge, Tenn., USA. url: www.ornl.gov/info/reports/1968/3445605101608.pdf.

Detournay, E. 2004. Propagation regimes of fluid-driven fractures in impermeable rocks. Int. J. Geomechanics volume 4 (1): 1-11.

El Rabaa, W. 1989. Experimental study of hydraulic fracture geometry initiated from horizontal wells. In Proceedings SPE Annual Technical Conference and Exhibition. San Antonio, Tex., USA. SPE 19720.

Erdogan, F. and Sih, G. 1963. On the crack extension in plates under plane loading and transverse shear. J Basic Eng—T ASME volume 85: 519-527.

Garagash, D. and Detournay, E. 2000. The tip region of a fluid-driven fracture in an elastic medium. ASME J. Appl. Mech. volume 67: 183-192.

Garagash, D. I. and Detournay, E. 2005. Plane strain propagation of a hydraulic fracture: Small-Toughness solution. ASME J. Appl. Mech. volume 72: 916-928.

Jeffrey, R., Weber, C., Vlahovic, W., and Enever, J. 1994. Hydraulic Fracturing Experiments in the Great Northern Coal Seam. In SPE Asia Pacific Oil & Gas Conference (pp. 361-371). Melbourne, Victoria, Australia.

Jeffrey, R. G., and Zhang, X. 2010. Mechanics of Hydraulic Fracture Growth from a Borehole, In CSUG/SPE Canadian Unconventional Resources and International Petroleum Conference, Calgary, Alberta, Canada. SPE/CSUG 137393.

Keleman, P. B. and Matter, J. 2008. In situ carbonation of peridotite for cot storage. Proc. Natl. Acad. Sci. volume 105 (45): 17295-17300.

McClain, W. C. 1969. The mechanics of hydraulic fractures in shales. In Proceedings 3rd International Symposium on Salt, volume 2. Cleveland, Ohio, USA.

Olsen, T., Gomez, E., McCrady, D., Forrest, G., Perakis, A., and Kaufman, P. 2009. "Stimulation Results and Completion Implications from the Consortium Multi-well Project in the North Dakota Bakken Shale." In Proceedings of SPE Annual Technical Conference and Exhibition. Society of Petroleum Engineers, 2009.

Rodrigues, V. F., Neumann, L. F., Torres, D., Guimaraes, C., and Torres, R. S. 2007. Horizontal well completion and stimulation techniques—A review with emphasis on low-permeability carbonates. In Proceedings SPE Latin American and Caribbean Petroleum Engineering Conference. Buenos Aires, Argentina. SPE 108075.

Roussel, N. P. and Sharma, M. M. 2010. Role of stress reorientation in the success of refracture treatments in tight gas sands. In Proceedings SPE Annual Technical Conference and Exhibition. Florence, Italy. SPE 134491.

Sadrpanah, H., Charles, T., and Fulton, J. 2006. Explicit simulation of multiple hydraulic fractures in horizontal wells. In Proceedings SPE Europec/EAGE Annual Conference and Exhibition. Vienna, Austria. SPE 99575.

Savitski, A. and Detournay, E. 2002. Propagation of a penny-shaped fluid-driven fracture in an impermeable rock: asymptotic solutions. Int. J. Solids Struct. volume 39: 6311-6337.

Sneddon, I. N. 1946. The distribution of stress in the neighborhood of a crack in an elastic solid. Proc. Roy. Soc. London A volume 187 (1009): 229-260.

Soliman, M. Y., Hunt, J. L., and El-Raaba, A. M. 1990. Fracturing aspects of horizontal wells. J. Pet. Tech. volume 42 (8): 966-973.

Spence, D. and Sharp, P. 1985. Self-similar solution for elastohydrodynamic cavity flow. Proc. Roy. Soc. London A volume 400: 289-313.

Steidl, P. 1993. Evaluation of Induced Fractures Intercepted by Mining. In 1993 International Coalbed Methane Symposium (pp. 675-686).

Sun, R. 1969. Theoretical size of hydraulically induced horizontal fractures and corresponding surface uplifts in an idealized medium. J. Geophys. Res. volume 74 (25): 5995-6011.

Tada, H., Paris, P. C., and Irwin, G. R. 2000. The Stress Analysis of Cracks Handbook. New York: ASME, 3rd edition.

van As, A. and Jeffrey, R. 2000. Caving induced by hydraulic fracturing at Northparkes Mines. In J. Girard, M. Liebman, C. Breeds, and T. Doe, editors, Pacific Rocks 2000—Proc. 4th North American Rock Mechanics Symposium, pages 353-360. Seatle, Wash.: Balkema.

Vogel, A. and Ballarini, R. 1999. Ultimate load capacities of plane strain and axisymmetric headed anchors, J. Eng. Mech. ASCE, 125, 1276-1279.

Warpinski, N., Lorenz, J., Branagan, P., Myal, F., & Gail, B. 1993. Examination of a Cored Hydraulic Fracture in a Deep Gas Well. SPE Production & Facilities, (August), 150-158.

Wiley, C., Barree, B., Eberhard, M., and Lantz, T. (2004) "Improved Horizontal Well Stimulations in the Bakken Formation, Williston Basin, Montana." In Proceedings of SPE Annual Technical Conference and Exhibition. Society of Petroleum Engineers, 2004. http://www.onepetro.org/mslib/servlet/onepetropreview? id=00090697&soc=SPE.

Zhang, X. and Jeffrey, R. G. 2008. Reinitiation or termination of fluid-driven fractures at frictional bedding interfaces. J. Geophys. Res. volume 113: B08416.

Zhang, X. and Jeffrey, R. G. 2009. Multiple fracture growth driven by fluid injection. In Abstracts—9th Hydraulic Fracturing Summit, pages 12-14. Sugar Land, Tex.

Zhang, X., Jeffrey, R. G., Bunger, A. P., and Thiercelin, M. 2010. Initiation and growth of a hydraulic fracture from a circular wellbore. Int. J. Rock Mech. Min. Sci. Submitted.

Zhang, X., Jeffrey, R. G., and Thiercelin, M. 2007. Deflection and propagation of fluid-driven fractures at frictional bedding interfaces: A numerical investigation. J. Struct. Geol. volume 29 (3): 396-410.

SI Metric Conversion Factors
1 L=0.006290 barrels
1 m3=35.3146 ft3
1 m=3.28084 ft
1 mm=0.03937 in
1 MPa=145.038 psi
1 GPa=145,038 psi
1 L/s=0.377386 barrels per minute
1 Pa·s=1000 cp
1 kg=2.20462 lbm

The invention claimed is:
1. A method for producing a forecast of curving of a new hydraulic fracture to be initiated in a vicinity of one or more fractures previously placed along a bore hole, comprising:
deriving from independent physical parameters that will affect growth of the new hydraulic fracture a series of dimensionless parameters as groupings of the physical parameters, which non-dimensional parameters are selected as similarity parameters with respect to a shape of the path of the new hydraulic fracture;
determining from the dimensionless similarity parameters an indication as to curving of the new hydraulic fracture; and
producing a forecast in accordance with said indication,
wherein the determination of said indication is made by sequentially comparing the determined values of the dimensionless similarity parameters with predetermined threshold values.

2. The method of claim 1, wherein the threshold values to which the dimensionless similarity parameters are compared are predetermined by numerical modelling.

3. The method of claim 1, wherein the similarity parameters include a dimensionless deviatoric stress based on a comparison of full field deviatoric stress with stress induced by the new hydraulic fracture.

4. The method of claim 1, wherein the similarity parameters include a dimensionless confining stress based on a comparison of far-field minimum stress with stress induced by the new fracture.

5. The method of claim 1, wherein the similarity parameters include a dimensionless viscosity.

6. The method of claim 1, wherein the similarity parameters include a dimensionless propped opening based on a comparison of stress induced by the new hydraulic fracture with stress induced by a prior placed fracture on one side of the new hydraulic fracture.

7. A method of planning the initiation of a series of new hydraulic fractures along a bore hole, comprising performing the method of claim 1 for differing individual dimensionless parameters to determine the possibility of curving of each new hydraulic fracture to be initiated and selecting dimensional parameters that provide non-dimensional similarity parameters found to favour non-curved fracture growth.

8. The method of claim 7, wherein a minimum spacing between adjacent hydraulic fractures is selected consistent with promotion of a substantially non-curved fracture growth.

9. A method of initiating a series of new hydraulic fractures along a bore hole, comprising obtaining a plan derived by the method of claim 7 and initiating a series of new hydraulic fractures in accordance with the selected dimensional parameters.

10. The method of claim 9, wherein the bore hole is notched at spaced locations for initiation of said new hydraulic fractures.

11. The method of claim 1, wherein the similarity parameters further include at least one of:
a dimensionless deviatoric stress based on a comparison of full field deviatoric stress with stress induced by the new hydraulic fracture;
a dimensionless confining stress based on a comparison of far-field minimum stress with stress induced by the new fracture; or
a dimensionless viscosity.

12. An apparatus for forecasting curving of a new hydraulic fracture to be initiated in a vicinity of one or more fractures previously placed along a bore hole comprising:
an input data receiver to receive input data indicative of independent physical parameters that will affect growth of the new hydraulic fracture;
a dimensionless parameter deriver to derive from the input data derived data indicative of a series of dimensionless parameters as groupings of the physical parameters that are effective as similarity parameters with respect to the shape of a growth path of the new hydraulic fracture;
a comparator to compare the derived data indicative of said dimensionless similarity parameters with predetermined threshold values providing an indication of possible curvature of the new hydraulic fracture path; and
an outputter to output a forecast of fracture curvature of the new hydraulic fracture in accordance with the indication provided by the comparator.

13. The apparatus of claim 12, wherein the dimensionless parameter deriver is configured to receive physical parameters affecting the growth of the new hydraulic fracture and to produce dimensionless parameters selected as similarity parameters with respect to the shape of the fracture path of the new hydraulic fracture.

14. The apparatus of claim 12, wherein the dimensionless parameters include any one or more of a viscosity parameter, a confirming stress parameter, a coefficient of friction parameter, and a deviatoric stress parameter.

15. The apparatus of claim 12, wherein the comparator includes a regime determiner configured to determine whether the fracture propagation regime is toughness dominated, viscosity dominated or transitional based on a comparison of a dimensionless viscosity parameter with respective dimensionless viscosity parameter upper and lower thresholds.

16. The apparatus of claim 12, wherein the comparator includes a fracture sliding analyser configured to determine whether sliding on a previously placed fracture or an elastic solution exists based on a comparison of the coefficient of friction parameter with a respective coefficient of friction parameter threshold.

17. The apparatus of claim 12, wherein the comparator includes an outcome determiner configured to produce an indication that curving is unlikely or that further analysis is required based on a comparison of a dimensionless deviation stress parameter with a respective dimensionless deviation stress parameter threshold.

18. A method for producing a forecast of curving of a new hydraulic fracture to be initiated in a vicinity of one or more fractures previously placed along a bore hole, comprising:
deriving from independent physical parameters that will affect growth of the new hydraulic fracture a series of dimensionless parameters as groupings of the physical parameters, which non-dimensional parameters are selected as similarity parameters with respect to the shape of the path of the new hydraulic fracture;
determining from the dimensionless similarity parameters an indication as to possible curving of the new hydraulic fracture; and
producing a forecast in accordance with said indication,
wherein the similarity parameters include a dimensionless propped opening based on a comparison of stress induced by the new hydraulic fracture with stress induced by a prior placed fracture on one side of the new hydraulic fracture.

19. The method of claim 18, wherein the determination of said indication is made by sequentially comparing the determined values of the dimensionless similarity parameters with predetermined threshold values which are predetermined by numerical modeling.

20. A method of planning an initiation of a series of new hydraulic fractures along a bore hole, comprising performing a forecasting method for producing a forecast of curving of a new hydraulic fracture to be initiated in a vicinity of one or more fractures previously placed along a bore hole for differing individual dimensionless parameters to determine a possibility of curving of each new hydraulic fracture to be initiated, said forecasting method comprising:
deriving from independent physical parameters that will affect growth of the new hydraulic fracture a series of dimensionless parameters as groupings of the physical parameters, which non-dimensional parameters are selected as similarity parameters with respect to a shape of a path of the new hydraulic fracture;
determining from the dimensionless similarity parameters an indication as to curving of the new hydraulic fracture; and
producing a forecast in accordance with said indication, wherein dimensional parameters are selected that provide non-dimensional similarity parameters found to favour non-curved fracture growth,
and wherein a minimum spacing between adjacent hydraulic fractures is selected consistent with promotion of a substantially non-curved fracture growth.

* * * * *